United States Patent
Chou et al.

(10) Patent No.: US 12,205,969 B2
(45) Date of Patent: Jan. 21, 2025

(54) METAL SHIELDING STRUCTURE TO REDUCE CROSSTALK IN A PIXEL ARRAY

(71) Applicant: Taiwan Semiconductor Manufacturing Company, Ltd., Hsinchu (TW)

(72) Inventors: Yu-Ching Chou, Taipei (TW); Ya-Chun Teng, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 129 days.

(21) Appl. No.: 17/248,258

(22) Filed: Jan. 15, 2021

(65) Prior Publication Data

US 2022/0231065 A1    Jul. 21, 2022

(51) Int. Cl.
*H01L 27/146* (2006.01)

(52) U.S. Cl.
CPC .. *H01L 27/14623* (2013.01); *H01L 27/14607* (2013.01); *H01L 27/14621* (2013.01); *H01L 27/14627* (2013.01); *H01L 27/1463* (2013.01); *H01L 27/14645* (2013.01); *H01L 27/14685* (2013.01)

(58) Field of Classification Search
CPC ......... H01L 27/14603; H01L 27/14607; H01L 27/14621; H01L 27/14623; H01L 27/14627; H01L 27/1463; H01L 27/14643; H01L 27/14645; H01L 27/14683; H01L 27/14685
See application file for complete search history.

(56) References Cited

U.S. PATENT DOCUMENTS

| | | | |
|---|---|---|---|
| 2021/0202546 A1* | 7/2021 | Liu | H01L 27/1463 |
| 2021/0233947 A1* | 7/2021 | Zang | H01L 27/14605 |
| 2022/0199668 A1* | 6/2022 | Ootani | H01L 27/146 |
| 2022/0336504 A1* | 10/2022 | Kitano | H01L 27/1461 |

* cited by examiner

*Primary Examiner* — Nelson Garces
(74) *Attorney, Agent, or Firm* — Harrity & Harrity, LLP

(57) ABSTRACT

A pixel array may include a metal shielding structure on a grid structure between pixel sensors in the pixel array. The metal shielding structure laterally extends outward from the grid structure to reflect photons of incident light that might otherwise travel between the grid structure and the isolation structure of the pixel sensors in the pixel array. The lateral extensions of the metal shielding reflect these photons to reduce crosstalk between adjacent pixel sensors, thereby increasing the performance of the pixel array.

20 Claims, 28 Drawing Sheets

METAL SHIELDING STRUCTURE TO REDUCE CROSSTALK IN A PIXEL ARRAY

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates read-out of the measurements. One type of image sensor commonly used in optical imaging devices is a back side illumination (BSI) image sensor. BSI image sensor fabrication can be integrated into semiconductor processes for low cost, small size, and high integration. Further, BSI image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
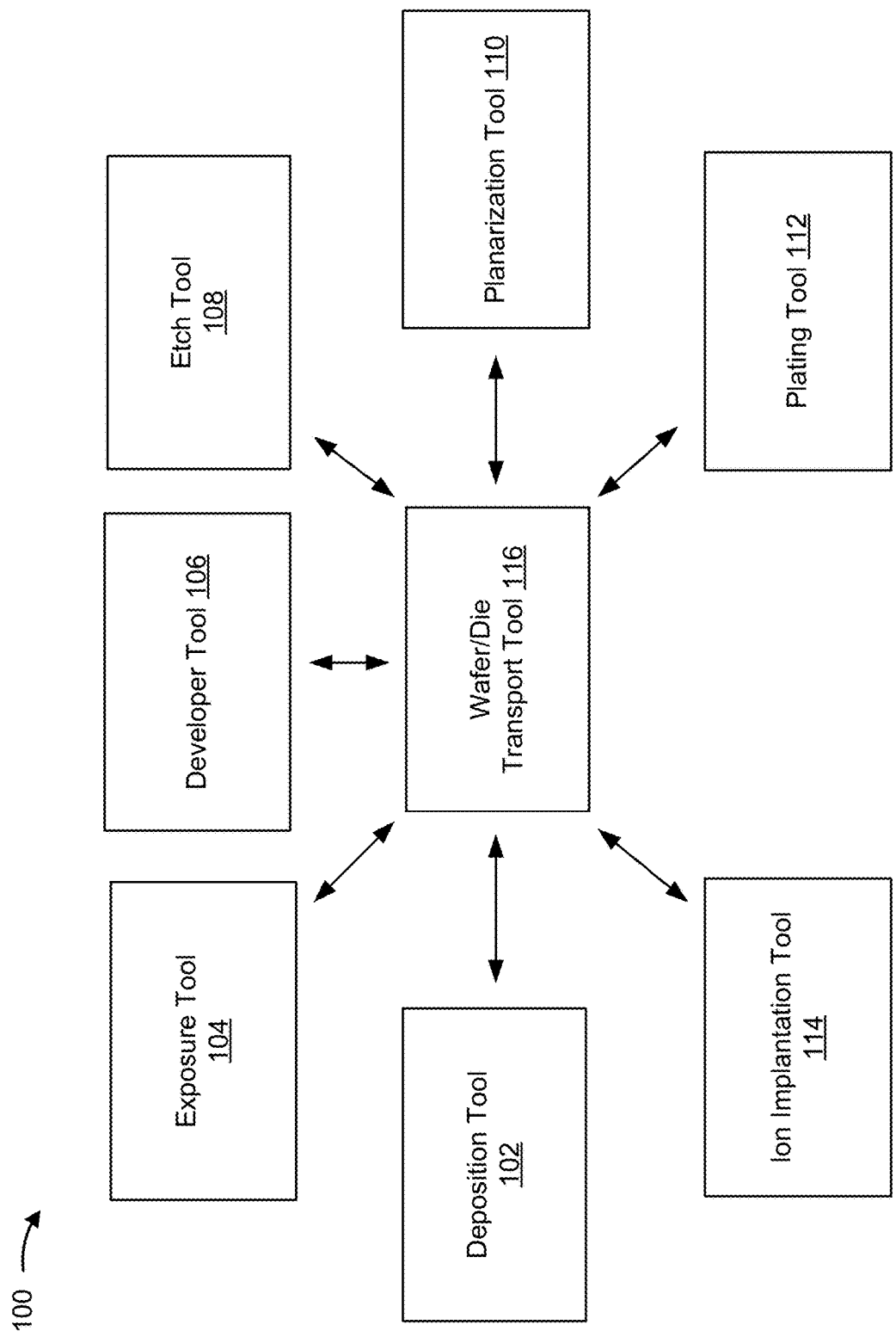
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Techniques may be used to reduce crosstalk between adjacent pixel sensors. One example technique includes forming an isolation structure on each side of a photodiode associated with a pixel sensor to reduce optical crosstalk. The isolation structure may reduce or prevent photons from diffusing into photodiodes of adjacent pixel sensors. However, photons traveling at some angles may travel between the isolation structure and a grid structure above the isolation structure, which may result in the photons being absorbed by an adjacent pixel sensor.

Some implementations described herein provide pixel arrays that include a metal shielding structure on a grid structure between pixel sensors in the pixel arrays. The metal shielding structure laterally extends outward from the grid structure to reflect photons of incident light that might otherwise travel between the grid structure and the isolation structure of the pixel sensors in the pixel arrays. The lateral extensions (also referred to herein as extension regions of the metal shielding structure) reflect these photons to reduce crosstalk between adjacent pixel sensors, thereby increasing the performance of the pixel arrays described herein.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
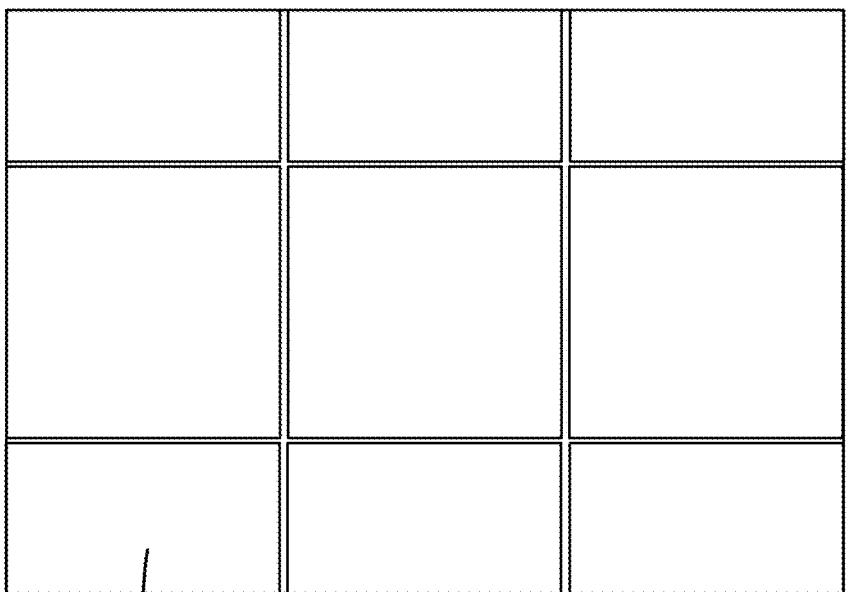
FIGS. 2-4 are diagrams of example pixel arrays described herein.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
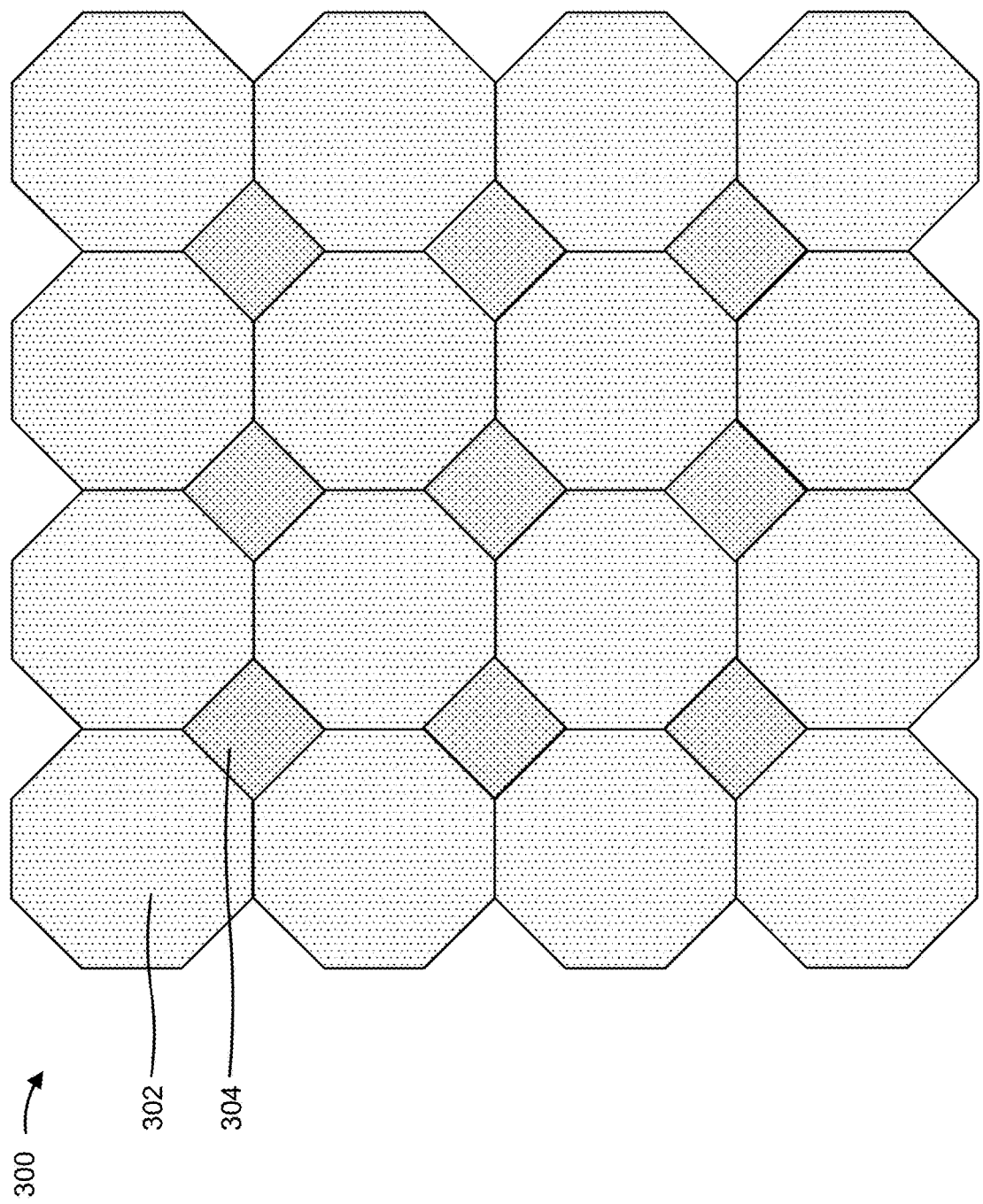

FIG. 3 is a diagram of an example pixel array 300 described herein. In some implementations, the pixel array 300 may be included in an image sensor. The image sensor may be a CMOS image sensor, a BSI CMOS image sensor, or another type of image sensor. As shown in FIG. 3, the pixel array 300 may include a plurality of octagon-shaped pixel sensors 302 and a plurality of square-shaped pixel sensors 304. The octagon-shaped pixel sensors 302 and the square-shaped pixel sensors 304 may be interspersed, intermixed, and/or distributed throughout the pixel array 300.

As shown in FIG. 3, a square-shaped pixel sensor 304 may be disposed between and/or surrounded by a subset of octagon-shaped pixel sensors 302 (e.g., 4 octagon-shaped pixel sensors 302) such that the sides of the octagon-shaped pixel sensors 302 align with the sides of the square-shaped pixel sensors 304. This reduces and/or minimizes unused gaps or portions between the pixel sensors of the pixel array 300, which increases the pixel sensor density of the pixel array 300 and increases spatial utilization in the pixel array 300.

Moreover, this particular arrangement permits the length of the sides of the octagon-shaped pixel sensors 302 to be adjusted to increase or decrease the size of the square-shaped pixel sensors 304 while maintaining the tight grouping of pixel sensors in the pixel array 300. For example, the length of the sides of octagon-shaped pixel sensors 302 facing a square-shaped pixel sensor 304 may be decreased to correspondingly decrease the size of the square-shaped pixel sensor 304. As another example, the length of the sides of octagon-shaped pixel sensors 302 facing a square-shaped pixel sensor 304 may be increased to correspondingly increase the size of the square-shaped pixel sensor 304. In addition, this particular arrangement permits the square-shaped pixel sensors 304 to be used with regular octagon-shaped pixel sensors (e.g., octagon-shaped pixel sensors having all sides the same length) and/or irregular octagon-shaped pixel sensors (e.g., octagon-shaped pixel sensors having two or more sides of different lengths).

As indicated above, FIG. 3 is provided as an example. Other examples may differ from what is described with regard to FIG. 3.

Figure 4:
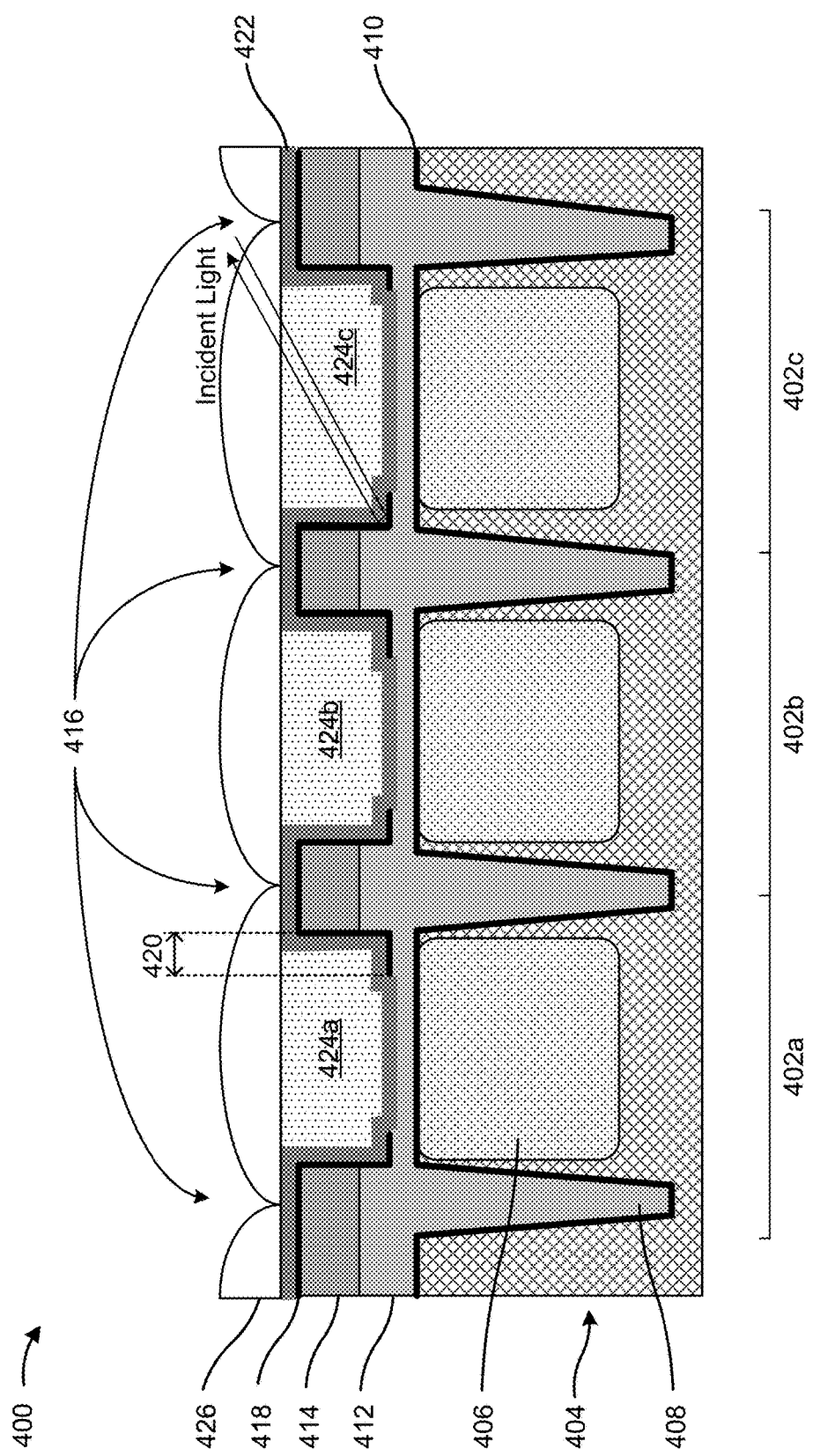

FIG. 4 is a diagram of an example pixel array 400 described herein. In some implementations, the example pixel array 400 illustrated in FIG. 4 may include, or may be included in, the pixel array 200 (or a portion thereof) and/or the pixel array 300 (or a portion thereof). In some implementations, the pixel array 400 may be included in an image sensor. The image sensor may be a CMOS image sensor, a BSI CMOS image sensor, or another type of image sensor.

As shown in FIG. 4, the pixel array 400 may include a plurality of adjacent pixel sensors 402, such as pixel sensors 402a-402c. In some implementations, the pixel sensors 402a-402c are configured as square-shaped pixel sensors 202 included in the pixel array 200. In some implementations, the pixel sensors 402a-402c are configured as octagon-shaped pixel sensors 302 and square-shaped pixel sensors 304, and are included in the pixel array 300. In some implementations, the pixel sensors 402a-402c include other shape(s) of pixel sensors or a combination thereof.

The pixel sensors 402 may be formed in a substrate 404, which may include a semiconductor die substrate, a semiconductor wafer, or another type of substrate in which semiconductor pixels may be formed. In some implementations, the substrate 404 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 402 may include a photodiode 406. A photodiode 406 may include a region of the substrate 404 that is doped with a plurality of types of ions to form a p-n junction or a PIN junction (e.g., a junction between a p-type portion, an intrinsic (or undoped) type portion, and an n-type portion). For example, the substrate 404 may be doped with an n-type dopant to form a first portion (e.g., an n-type portion) of a photodiode 406 and a p-type dopant to form a second portion (e.g., a p-type portion) of the photodiode 406. A photodiode 406 may be configured to absorb photons of incident light. The absorption of photons causes a photodiode 406 to accumulate a charge (referred to as a photocurrent) due to the photoelectric effect. Here, photons bombard the photodiode 406, which causes emission of electrons of the photodiode 406. The emission of electrons causes the formation of electron-hole pairs, where the electrons migrate toward the cathode of the photodiode 406 and the holes migrate toward the anode, which produces the photocurrent.

An isolation structure 408 may be included in the substrate 404 between adjacent pixel sensors 402. The isolation structure 408 may provide optical isolation by blocking or preventing diffusion or bleeding of light from one pixel sensor 402 to another pixel sensor 402, thereby reducing crosstalk between adjacent pixel sensors 402. The isolation structure 408 may include trenches or deep trench isolation (DTI) structures that are coated or lined with an antireflective coating (ARC) 410 and filled with an oxide layer 412 (e.g., over the ARC 410). The isolation structure 408 may be formed in a grid layout in which the isolation structure 408 extends around the perimeters of the pixel sensors 402 in the pixel array 400 and intersects at various locations of the pixel array 400. In some implementations, the isolation structure 408 is formed in the backside of the substrate 404 to provide optical isolation between the pixel sensors 402, and thus may be referred to as a backside DTI (BDTI) structure.

The ARC 410 may be included within the isolation structures 408 and on the substrate 404 above the photodiodes 406. The ARC 410 may include a suitable material for reducing a reflection of incident light projected toward the photodiodes 406. For example, the ARC 410 may include nitrogen-containing material. In some implementations, a semiconductor processing tool (e.g., deposition tool 102) may form the ARC 410 to a thickness in a range from approximately 200 angstroms to approximately 1000 angstroms.

The oxide layer 412 may function as a dielectric buffer layer between the photodiodes 406 and the layers above the photodiodes 406. The oxide layer 412 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between the pixel sensors 402.

A metal layer 414 may be included above and/or on the oxide layer 412. The metal layer 414 may include a metallic material such as tungsten (W), copper (Cu), aluminum (Al), cobalt (Co), nickel (Ni), titanium (Ti), tantalum (Ta), another conductive material, and/or an alloy including one or more of the foregoing. The metal layer 414 may be etched such that a grid structure 416 is formed between the pixel sensors 402 and over the isolation structure 408. The grid structure 416 may include a plurality of interconnected columns of the metal layer 414. The grid structure 416 may surround the perimeters of the pixel sensors 402, and may be configured to provide additional crosstalk reduction and/or mitigation in combination with the isolation structure 408. The metal layer 414 may be formed to a thickness of approximately 10 angstroms to approximately 2000 angstroms.

In some implementations, the sidewalls of the grid structure 416 are substantially straight and parallel (e.g., the sidewalls are at an approximately 90 degree angle relative to the top surface of the sidewalls). In some implementations, the sidewalls of the grid structure 416 are angled or tapered. In these examples, the sidewalls may taper between the top and the bottom of the grid structure 416 at an angle (e.g., a 95 degree angle) relative to the top surface of the grid structure 416 such that the bottom of the grid structure 416 is wider relative to the top of the grid structure 416. In some implementations, the particular angle of the sidewalls may be based on an amount of incident light that the grid structure 416 is to block (e.g., a greater angle may block less amount of light relative to a smaller angle). In some implementations, a height of all or a portion of the grid structure 416 may be in a range from approximately 1500 angstroms to approximately 3000 angstroms. In some implementations, a width of all or a portion of the grid structure 416 may be in a range from approximately 190 nanometers to approximately 500 nanometers.

To further reduce crosstalk between adjacent pixel sensors 402, a metal shielding structure 418 may be included over and/or on the grid structure 416. The metal shielding structure 418 may include extension regions 420 that extend laterally outward from the grid structure 416 at the bottom of the grid structure 416. The extension regions 420 may extend and/or may be located over at least a portion of the photodiodes 406 to block and/or reflect incident light that might otherwise travel between the grid structure 416 and the isolation structure 408, as shown in FIG. 4.

In some implementations, the length of the extension regions 420 (e.g., the length that the metal shielding structure extends from the grid structure 416 over the photodiodes 406) may be in a range of approximately $1/10^{th}$ to approximately $1/5^{th}$ of the surface area of the top surface of the photodiodes 406 between the isolation structure 408 to provide sufficient light blockage to reduce crosstalk and to reduce the impact on the light absorption of the photodiodes 406. As an example, the length of the extension regions 420 (e.g., the length that the metal shielding structure extends from the grid structure 416 over the photodiodes 406) may be in a range from approximately 20 nanometers to approximately 100 nanometers. The amount of crosstalk reduction may increase as the length of the extension regions 420 is increased (which may also cause the light absorption to decrease because a greater area of the photodiodes 406 is covered by the metal shielding structure 418). Conversely, the amount of crosstalk reduction may decrease as the length of the extension regions 420 is decreased (which may also cause the light absorption to increase because a smaller area of the photodiodes 406 is covered by the metal shielding structure 418).

The metal shielding structure 418 (and thus, the extension regions 420) may include a metallic material that has a relatively high dielectric constant and a relatively high reflection rate to sufficiently block and/or reflect incident light. For example, the metal shielding structure 418 may include a metallic material having a dielectric constant that is greater than the dielectric constant of silicon dioxide ($SiO_2$) (e.g., greater than approximately 3.9) and a reflectance rate that is greater than silicon dioxide ($SiO_2$) such that the metal shielding structure 418 is sufficiently opaque (as low dielectric constant (low-k) materials are typically light-permeable) to block and reflect incident light. Examples of materials include, but are not limited to, tungsten (W), copper (Cu), aluminum (Al), cobalt (Co), nickel (Ni), titanium (Ti), or tantalum (Ta). Other examples of materials include a silicon nitride ($SiN_x$), a titanium nitride ($TiN_x$), a tantalum nitride ($TaN_x$), a hafnium oxide ($HfO_x$), a tantalum oxide ($TaO_x$), an aluminum oxide ($AlO_x$), a zirconium oxide ($ZrO_x$), or silicon germanium (SiGe). The metal shielding structure 418 may be formed to a thickness in a range of approximately 10 angstroms (to ensure continuity of the metal shielding structure 418) and approximately 2000 angstroms (so that the thickness of the metal shielding structure 418 is equal to or less than the thickness of the grid structure 416).

A passivation layer 422 may be included over the grid structure 416, over the metal shielding structure 418, and over the portions of the oxide layer 412 that are not covered by the metal shielding structure 418. The passivation layer 422 may be conformally deposited to a thickness in a range of approximately 10 angstroms to approximately 200 angstroms. The passivation layer 422 may include an oxide material to provide protection for the layers beneath the passivation layer 422 from the layers and structures that are formed above the passivation layer 422.

Respective color filter regions 424 may be included in the areas between the grid structure 416 and on the passivation layer 422. For example, a color filter region 424a may be formed in between the grid structure 416 over the photodiode 406 of the pixel sensor 402a, a color filter region 424b may be formed in between the grid structure 416 over the photodiode 406 of the pixel sensor 402b, a color filter region 424c may be formed in between the grid structure 416 over the photodiode 406 of the pixel sensor 402c, and so on. Alternatively, the areas between the grid structure 416 may be completely filled with the passivation layer 422, and a color filter layer including the color filter regions 424 may be formed above the grid structure 416 on the passivation layer 422.

Each color filter region 424 may be configured to filter incident light to allow a particular wavelength of the incident light to pass to a photodiode 406 of an associated pixel sensor 402. For example, the color filter region 424a included in the pixel sensor 402a may filter red light for the pixel sensor 402a (and thus, the pixel sensor 402a may be a red pixel sensor), the color filter region 424b included in the pixel sensor 402b may filter green light for the pixel sensor 402b (and thus, the pixel sensor 402b may be a green pixel sensor), the color filter region 424c included in the pixel sensor 402c may filter blue light for the pixel sensor 402c (and thus, the pixel sensor 402c may be a blue pixel sensor), and so on.

A blue filter region may permit the component of incident light near a 450 nanometer wavelength to pass through a color filter region 424 and block other wavelengths from passing. A green filter region may permit the component of incident light near a 550 nanometer wavelength to pass through a color filter region 424 and block other wavelengths from passing. A red filter region may permit the component of incident light near a 650 nanometer wavelength to pass through a color filter region 424 and block other wavelengths from passing. A yellow filter region may permit the component of incident light near a 580 nanometer wavelength to pass through a color filter region 424 and block other wavelengths from passing.

In some implementations, the color filter region 424 may be non-discriminating or non-filtering, which may define a white pixel sensor. A non-discriminating or non-filtering color filter region 424 may include a material that permits all wavelengths of light to pass into the associated photodiode 406 (e.g., for purposes of determining overall brightness to increase light sensitivity for the image sensor). In some implementations, a color filter region 424 may be a near infrared (NIR) bandpass color filter region, which may define an NIR pixel sensor. An NIR bandpass color filter region 424 may include a material that permits the portion of incident light in an NIR wavelength range to pass to an associated photodiode 406 while blocking visible light from passing.

A micro-lens layer 426 may be included above and/or on the color filter regions 424. The micro-lens layer 426 may include a respective micro-lens for each of the pixel sensors 402. For example, a micro-lens may be formed to focus incident light toward the photodiode 406 of the pixel sensor 402a, another micro-lens may be formed to focus incident light toward the photodiode 406 of the pixel sensor 402b, another micro-lens may be formed to focus incident light toward the photodiode 406 of the pixel sensor 402c, and so on.

As indicated above, FIG. 4 is provided as an example. Other examples may differ from what is described with regard to FIG. 4.

Figure 5A:
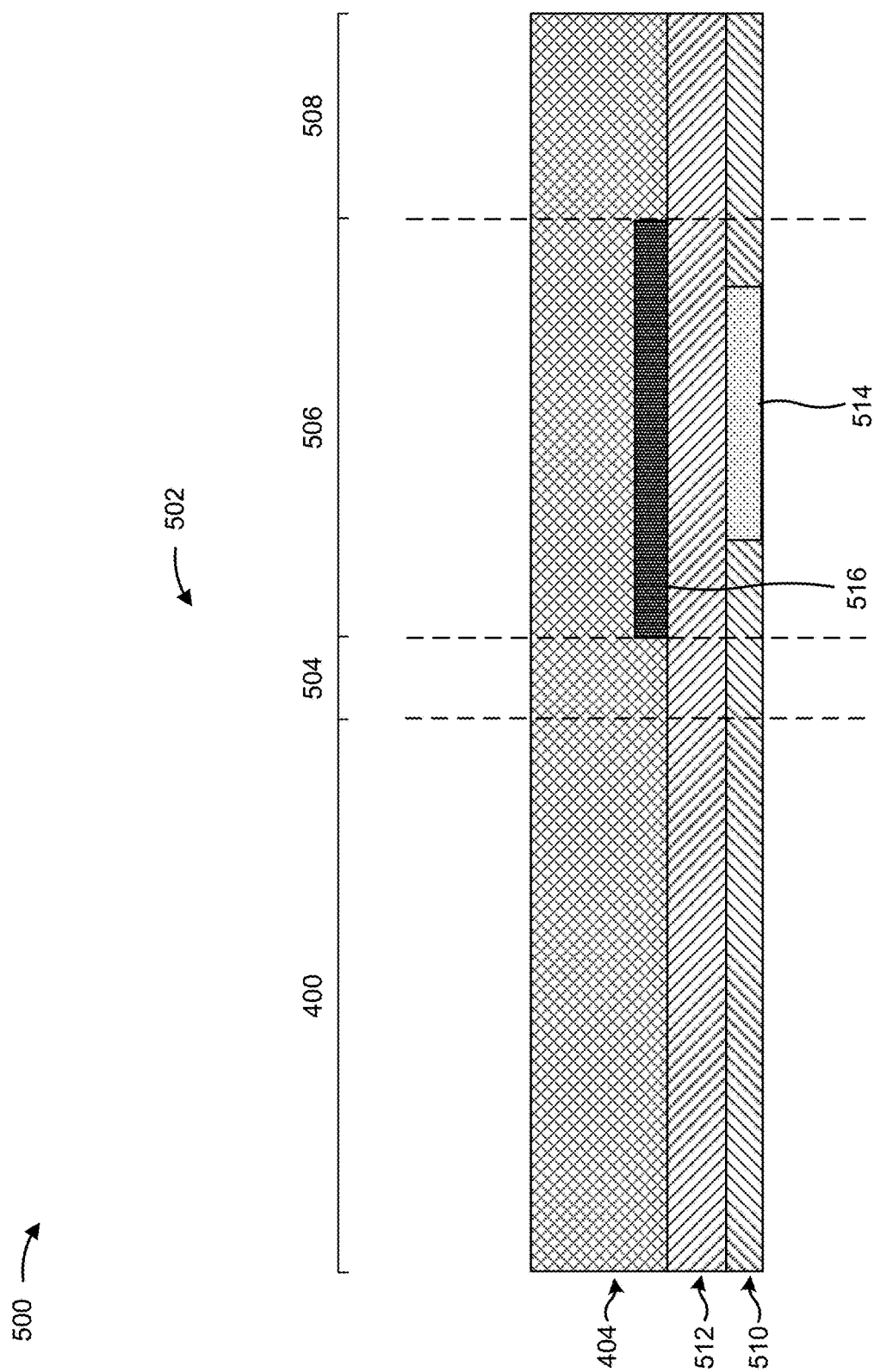
FIGS. 5A-5S are diagrams of an example implementation described herein.
Figure 5B:
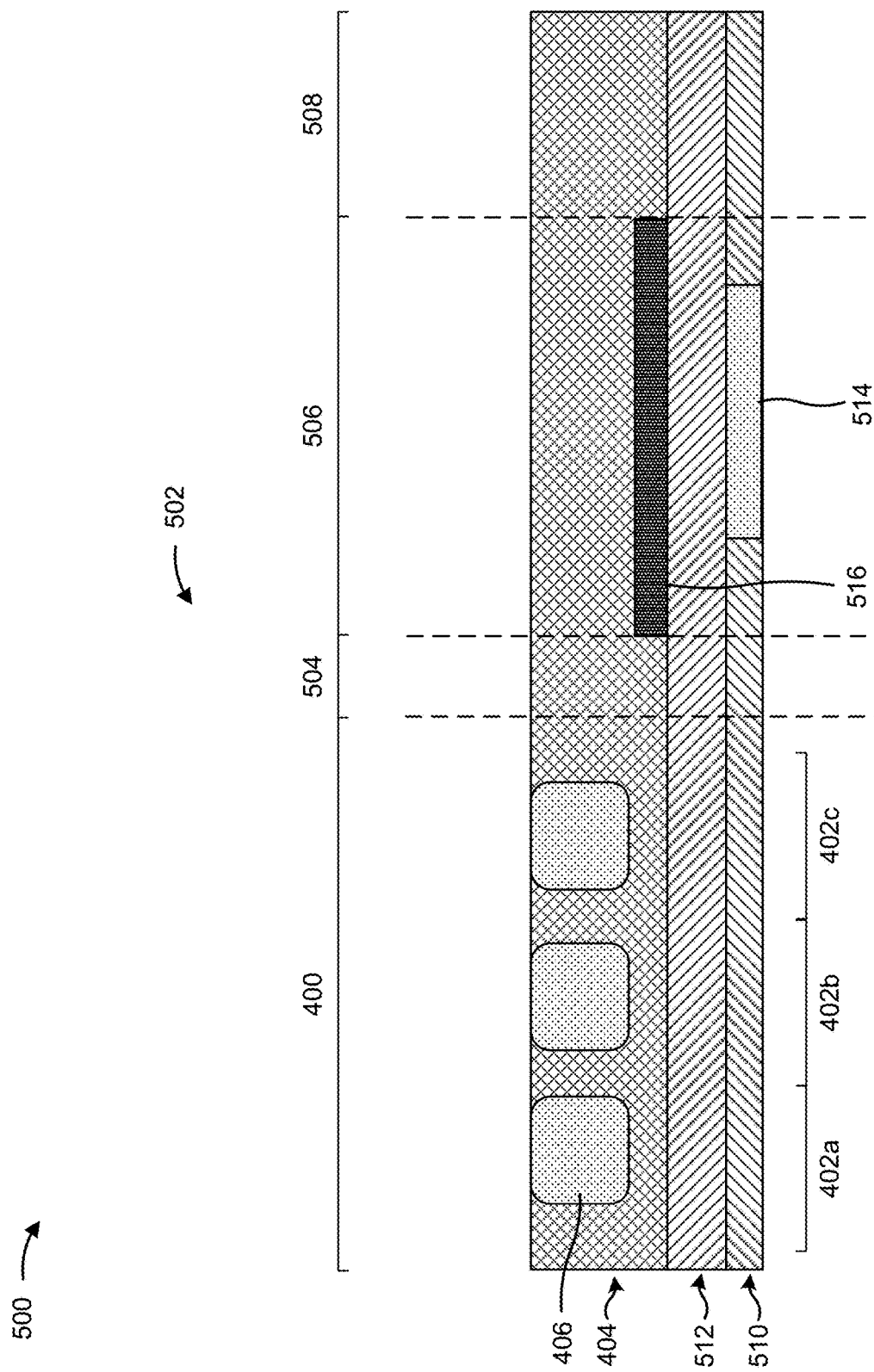
Figure 5C:
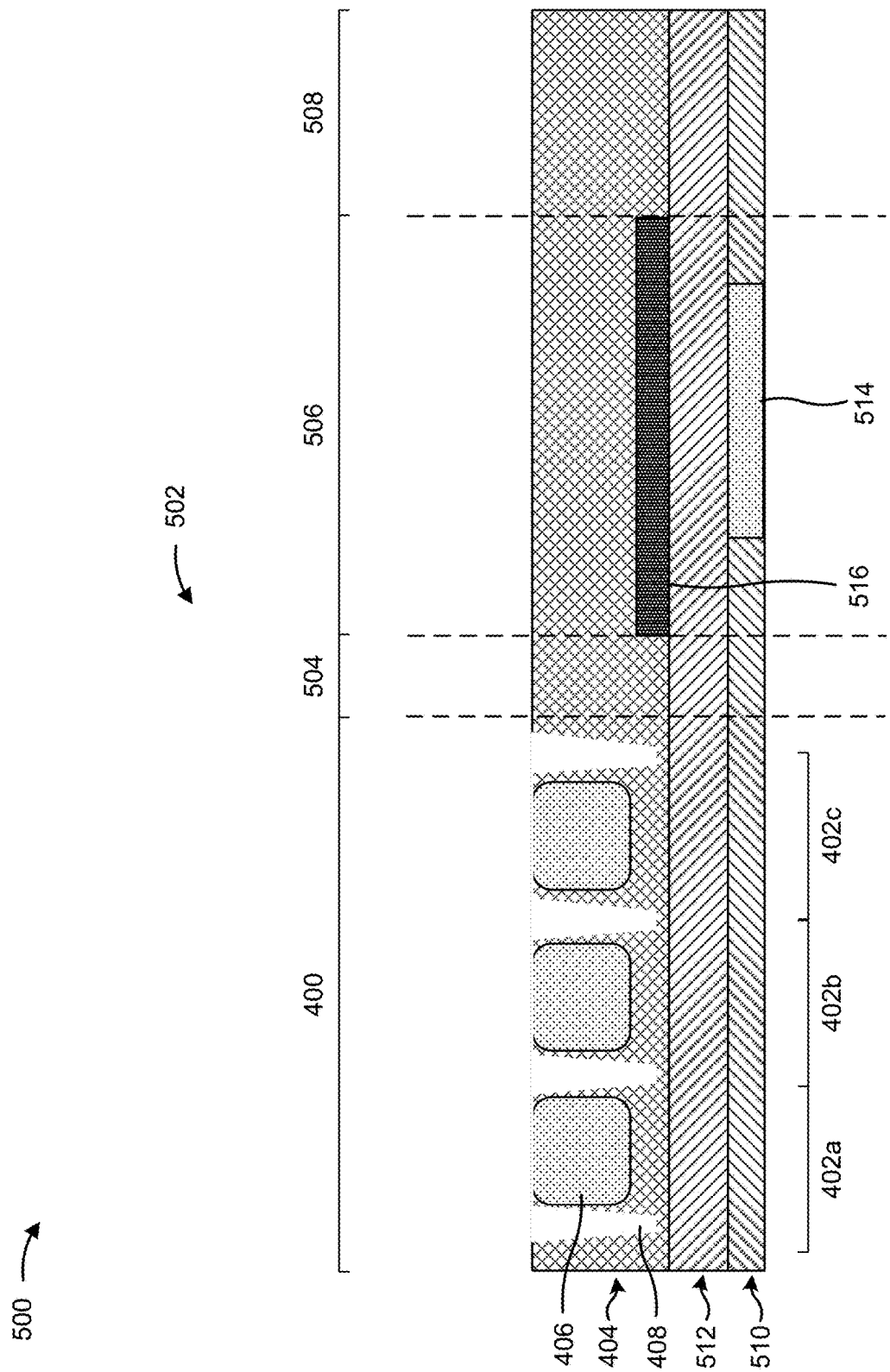
Figure 5D:
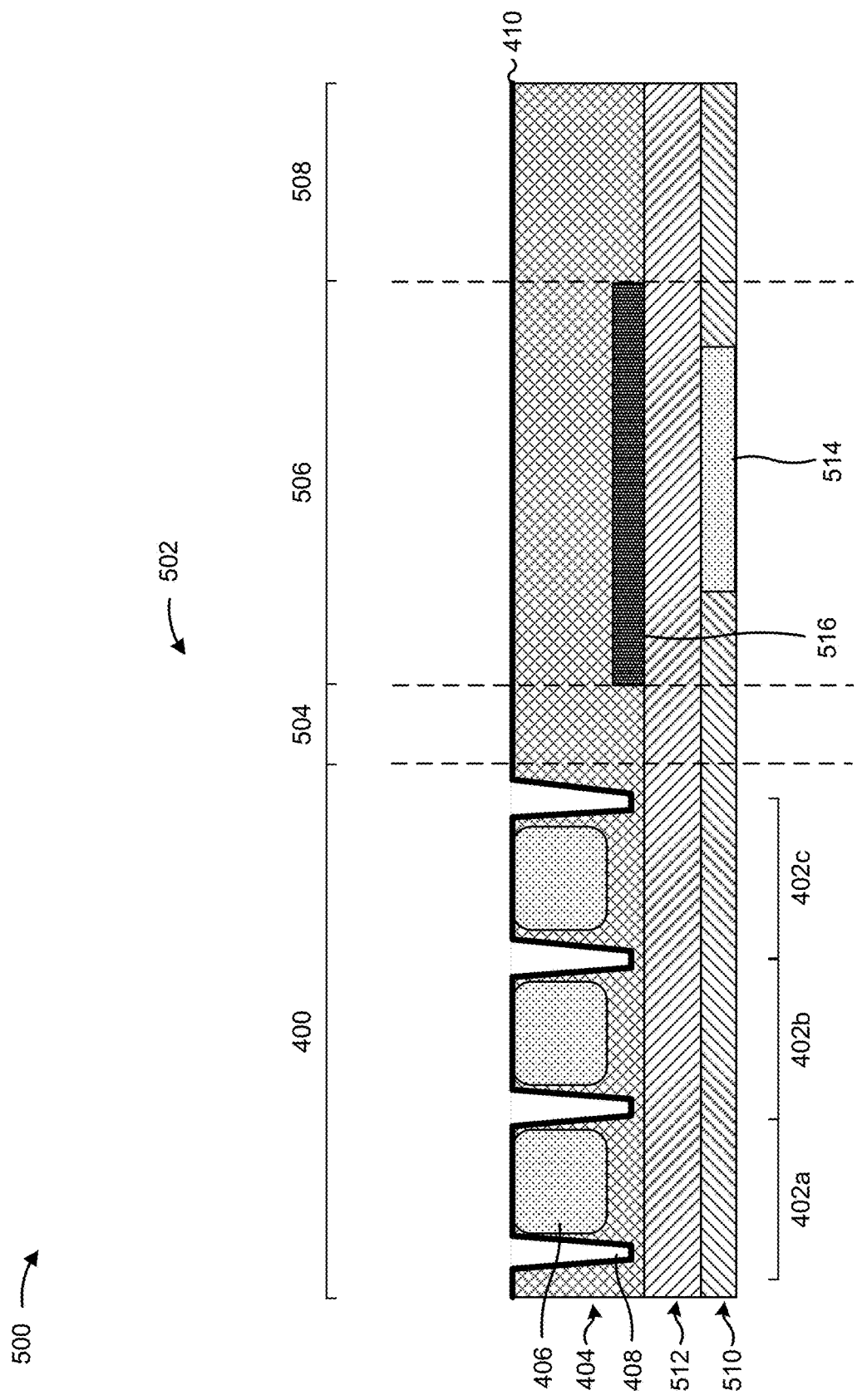
Figure 5E:
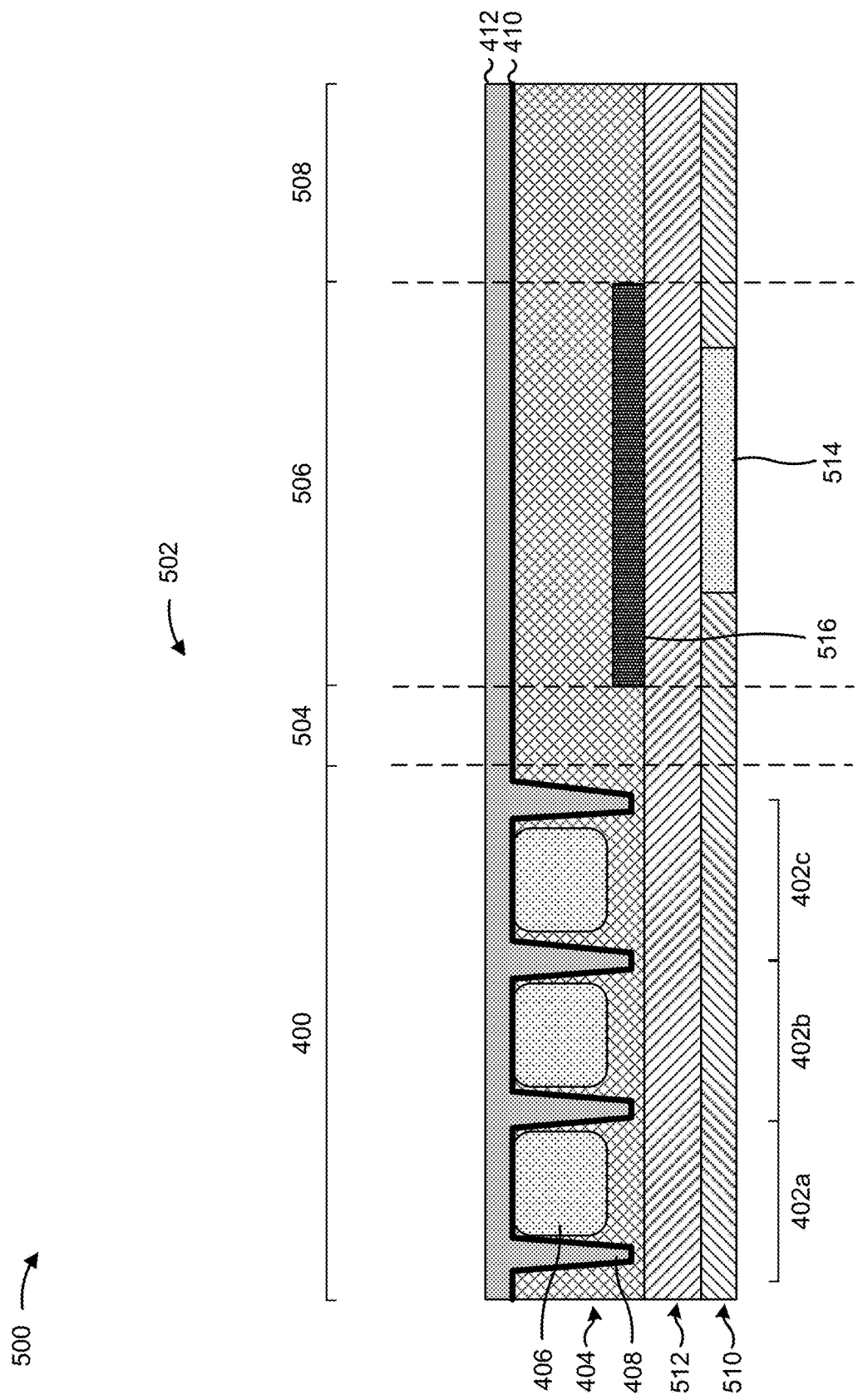
Figure 5F:
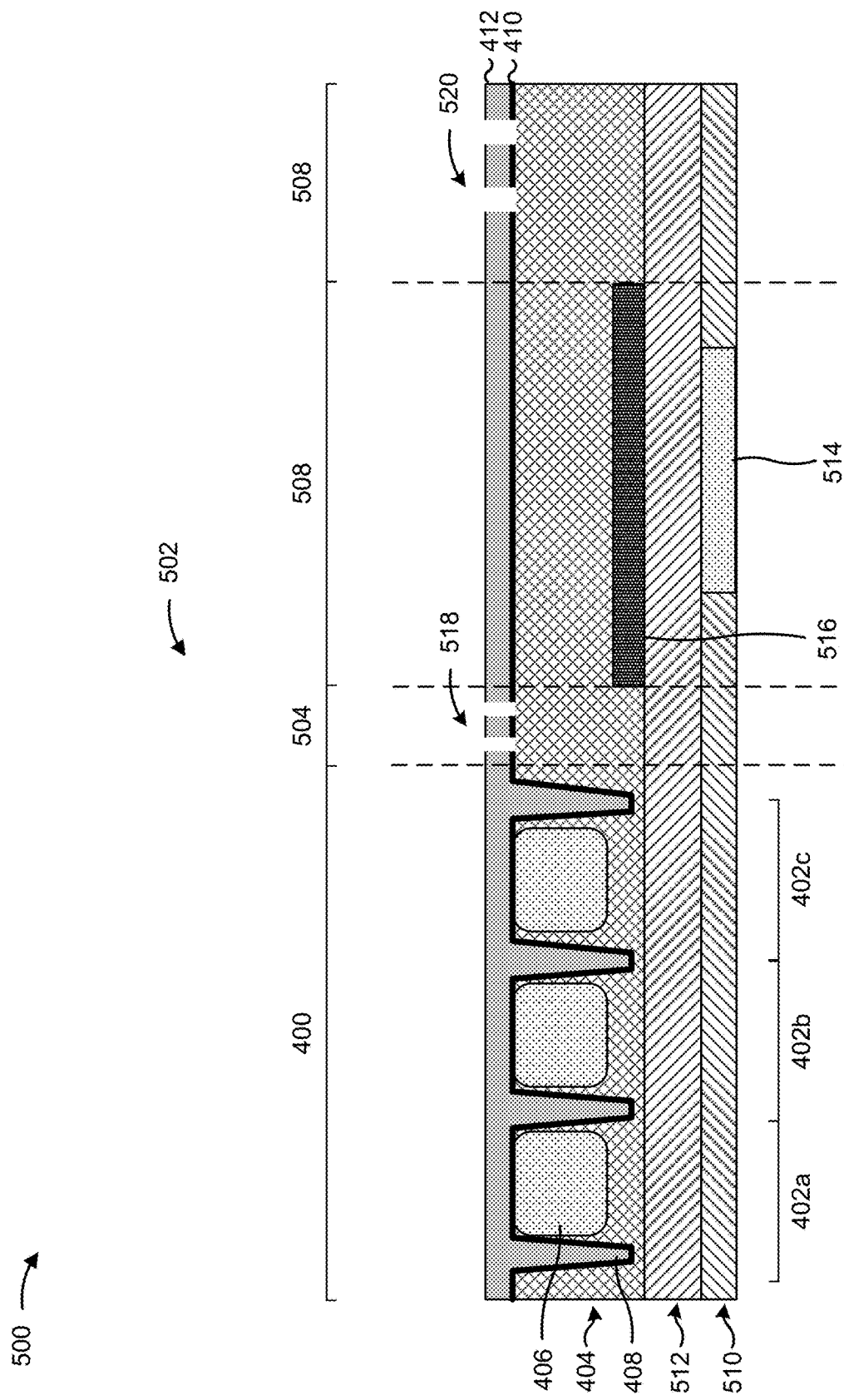
Figure 5G:
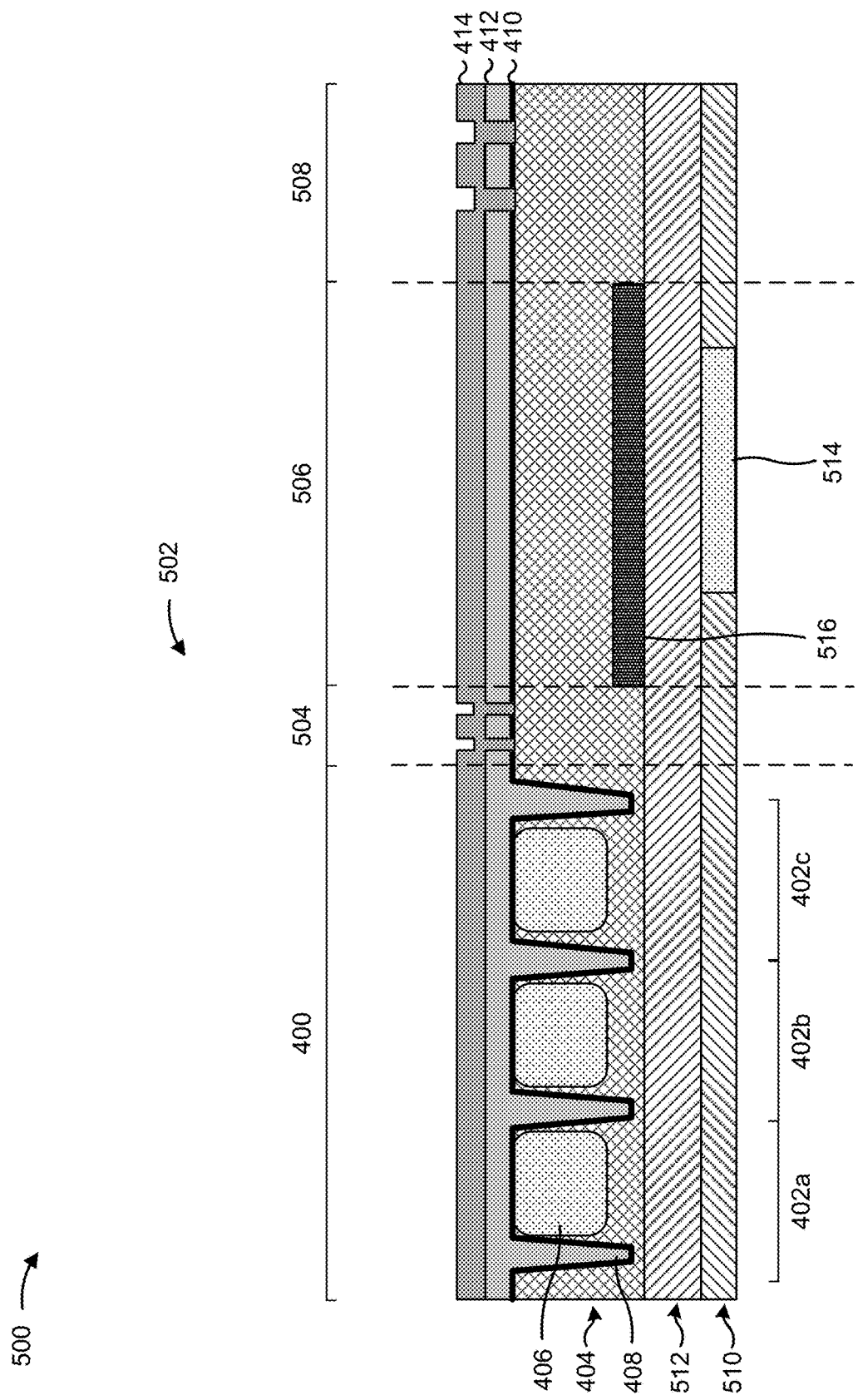
Figure 5H:
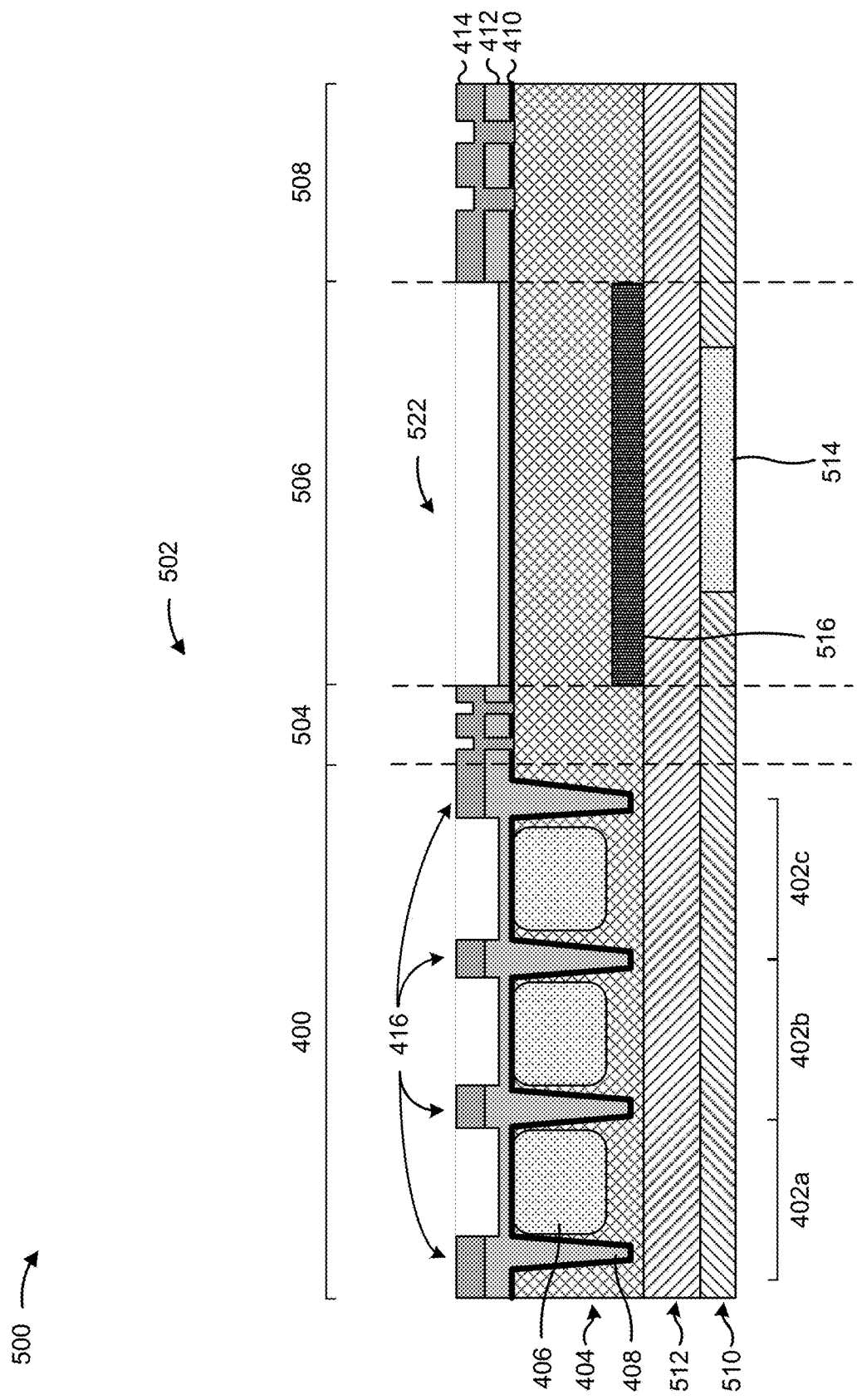
Figure 5I:
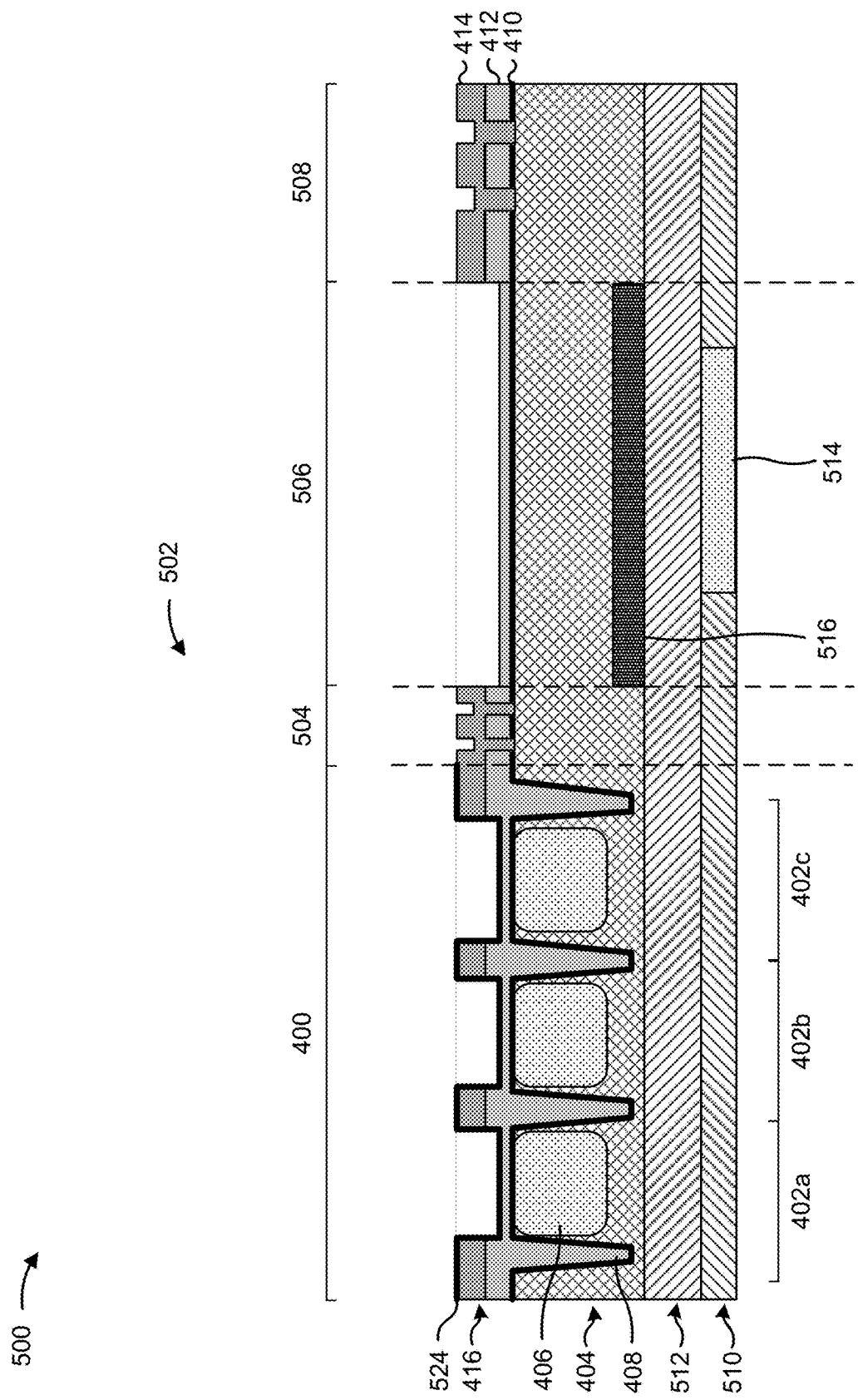
Figure 5J:
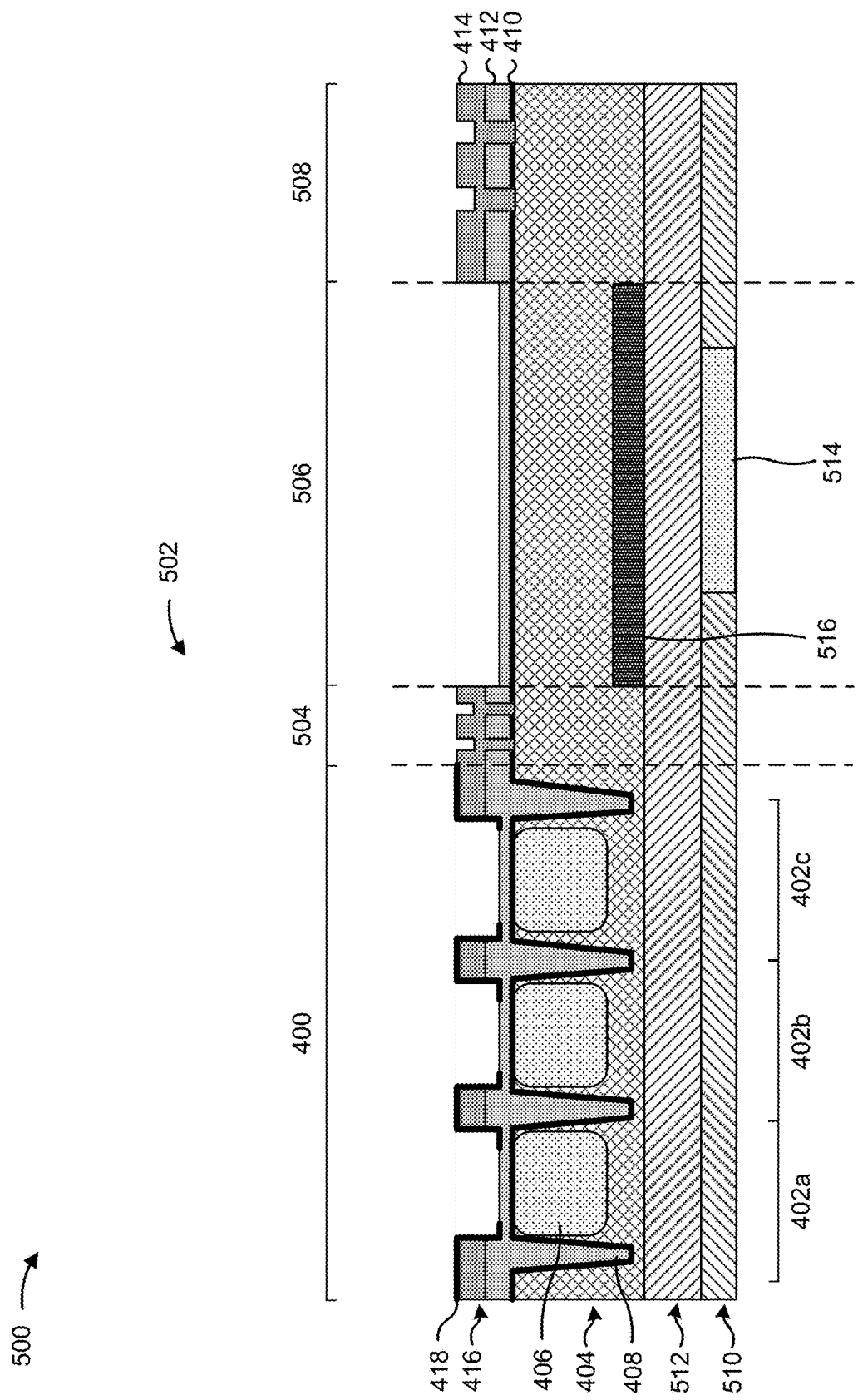
Figure 5L:
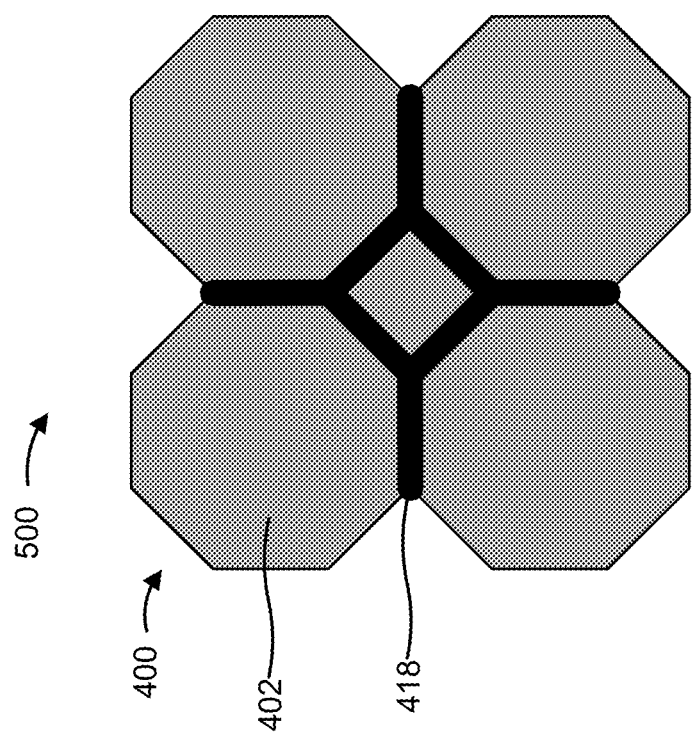
Figure 5K:
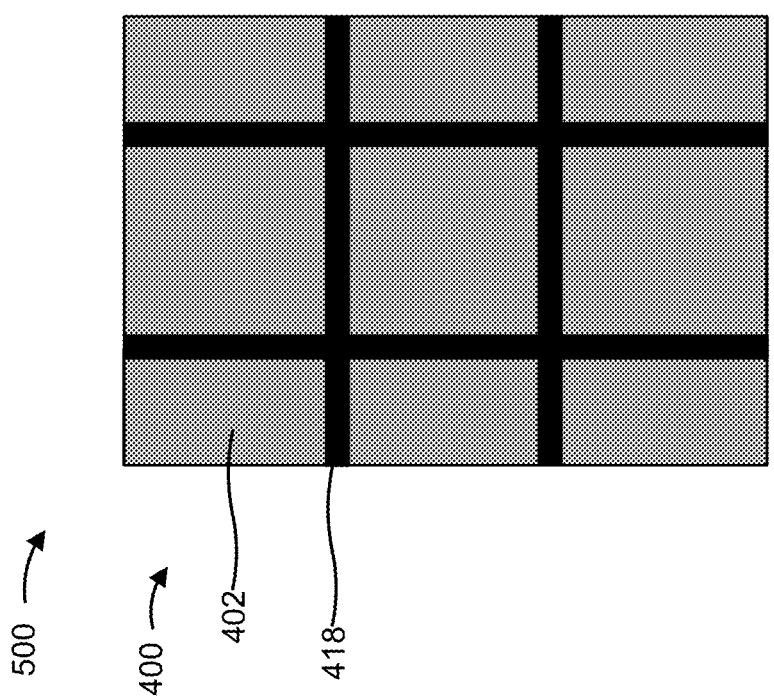
Figure 5M:
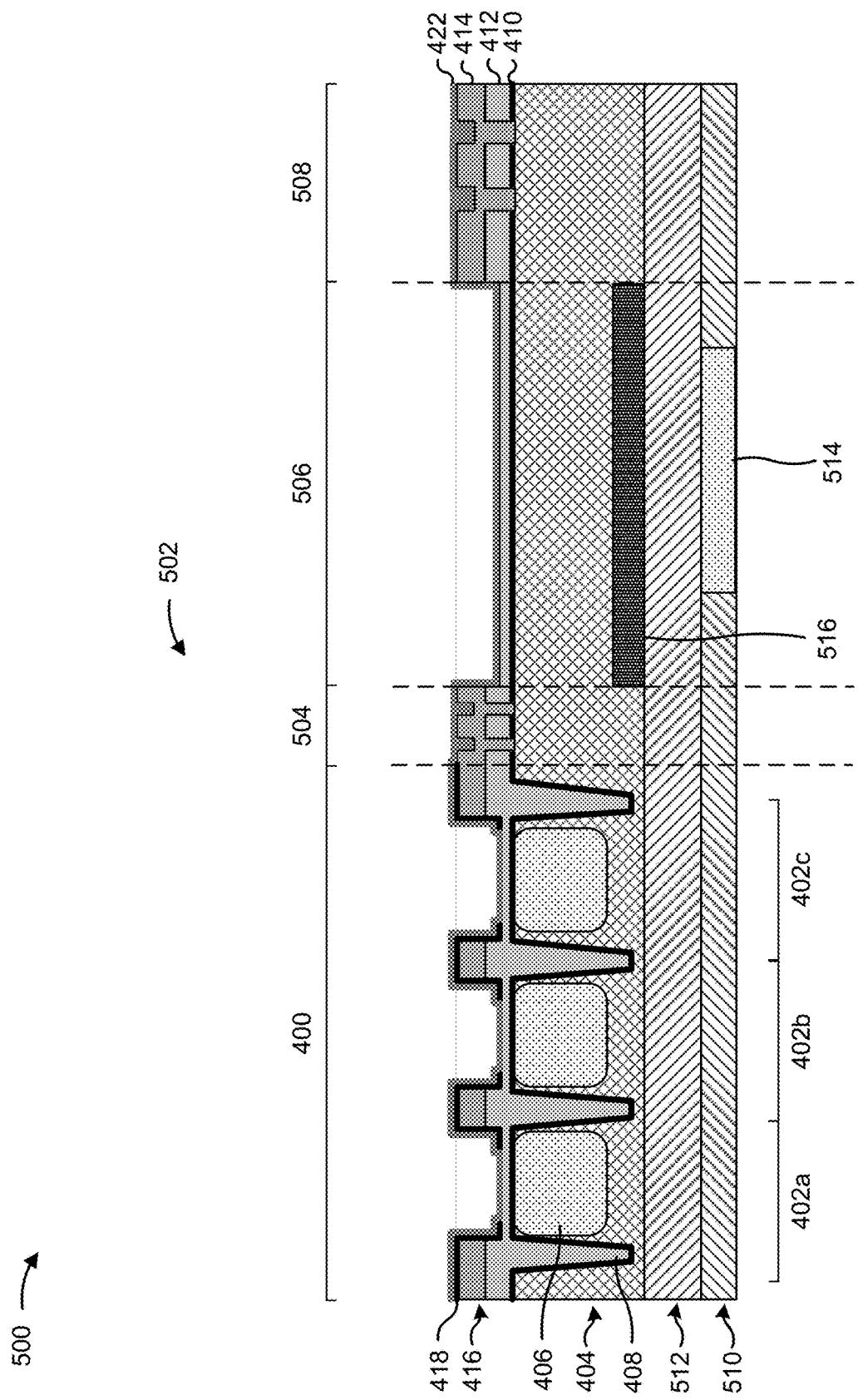
Figure 5N:
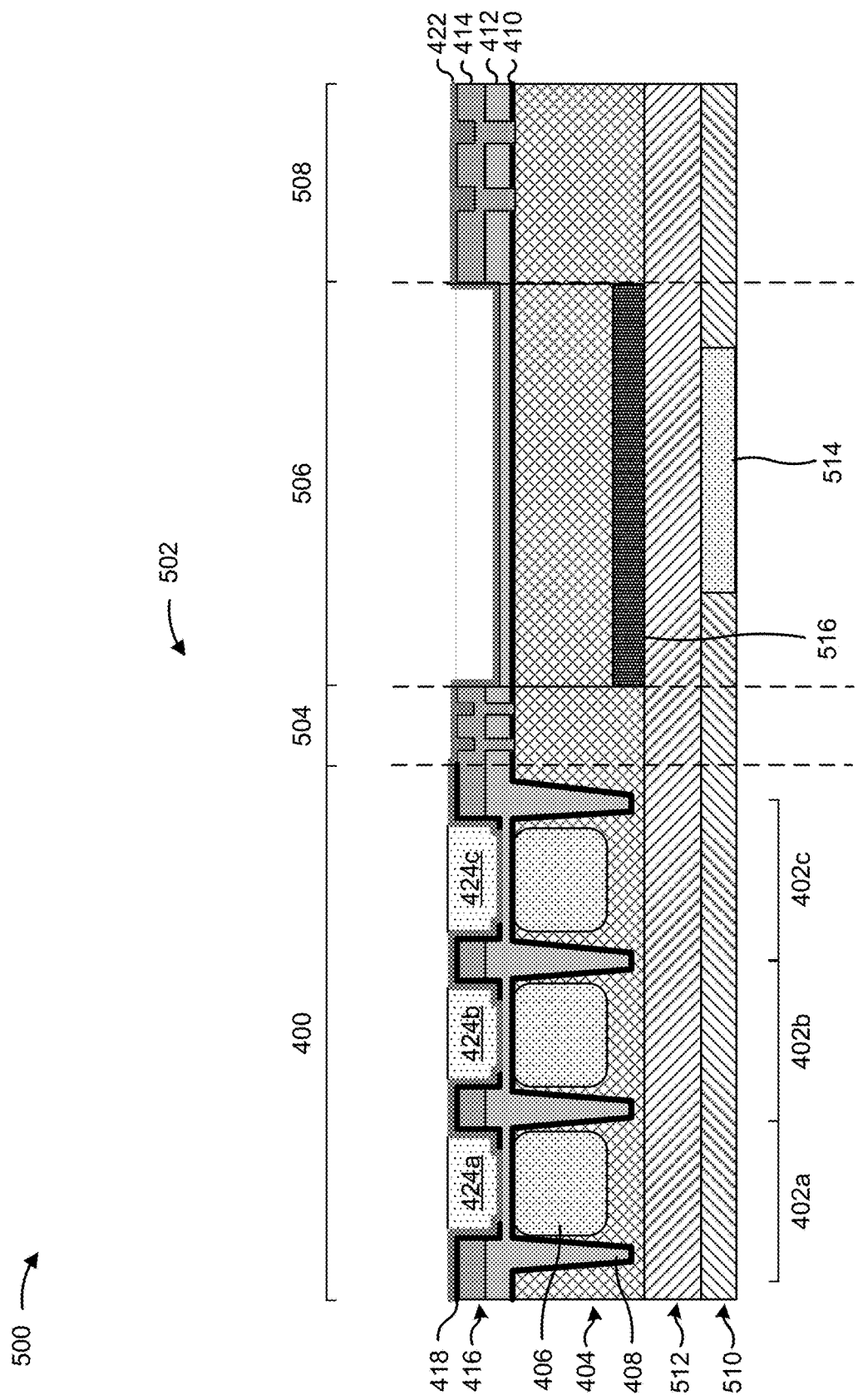
Figure 5O:
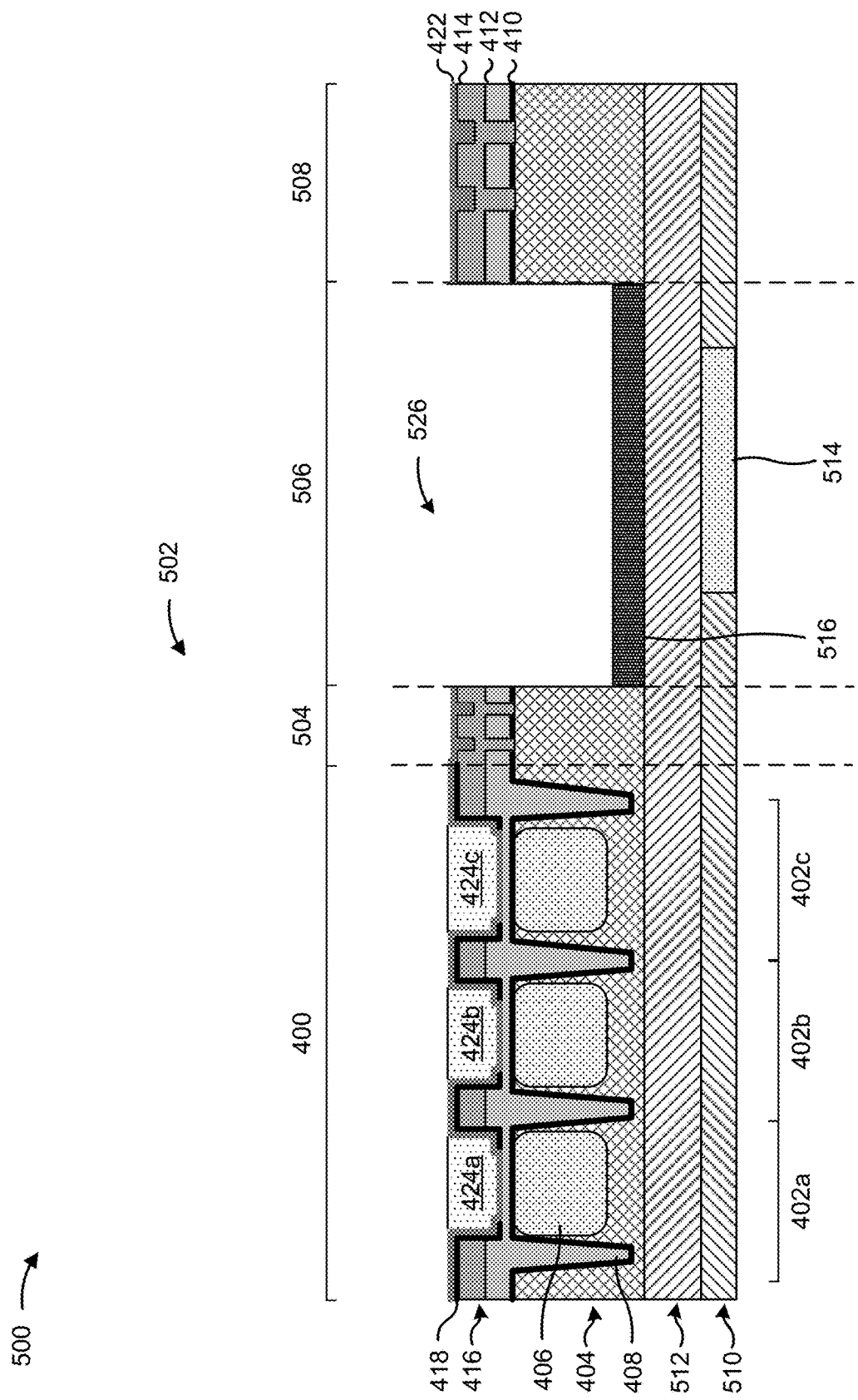
Figure 5P:
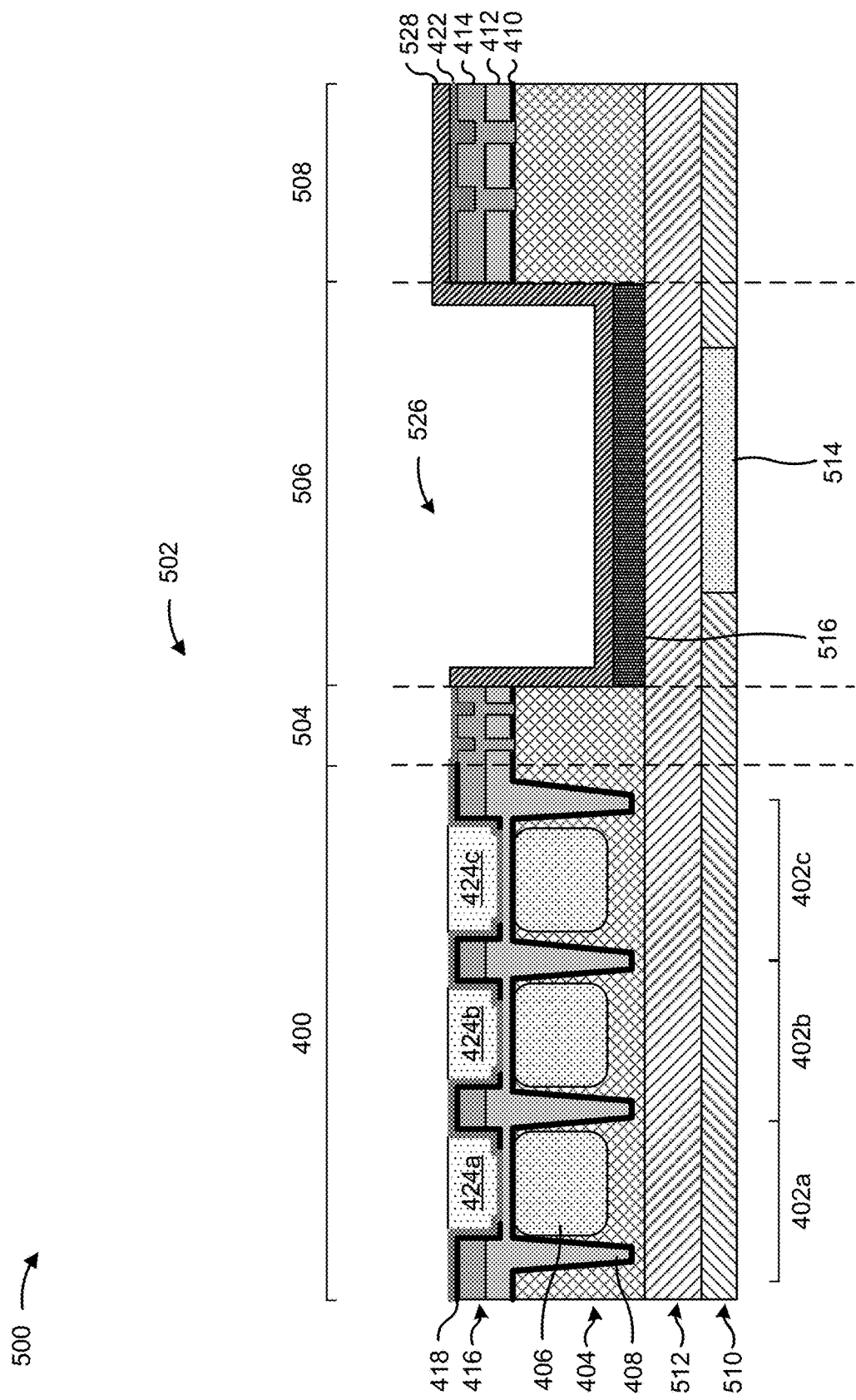
Figure 5Q:
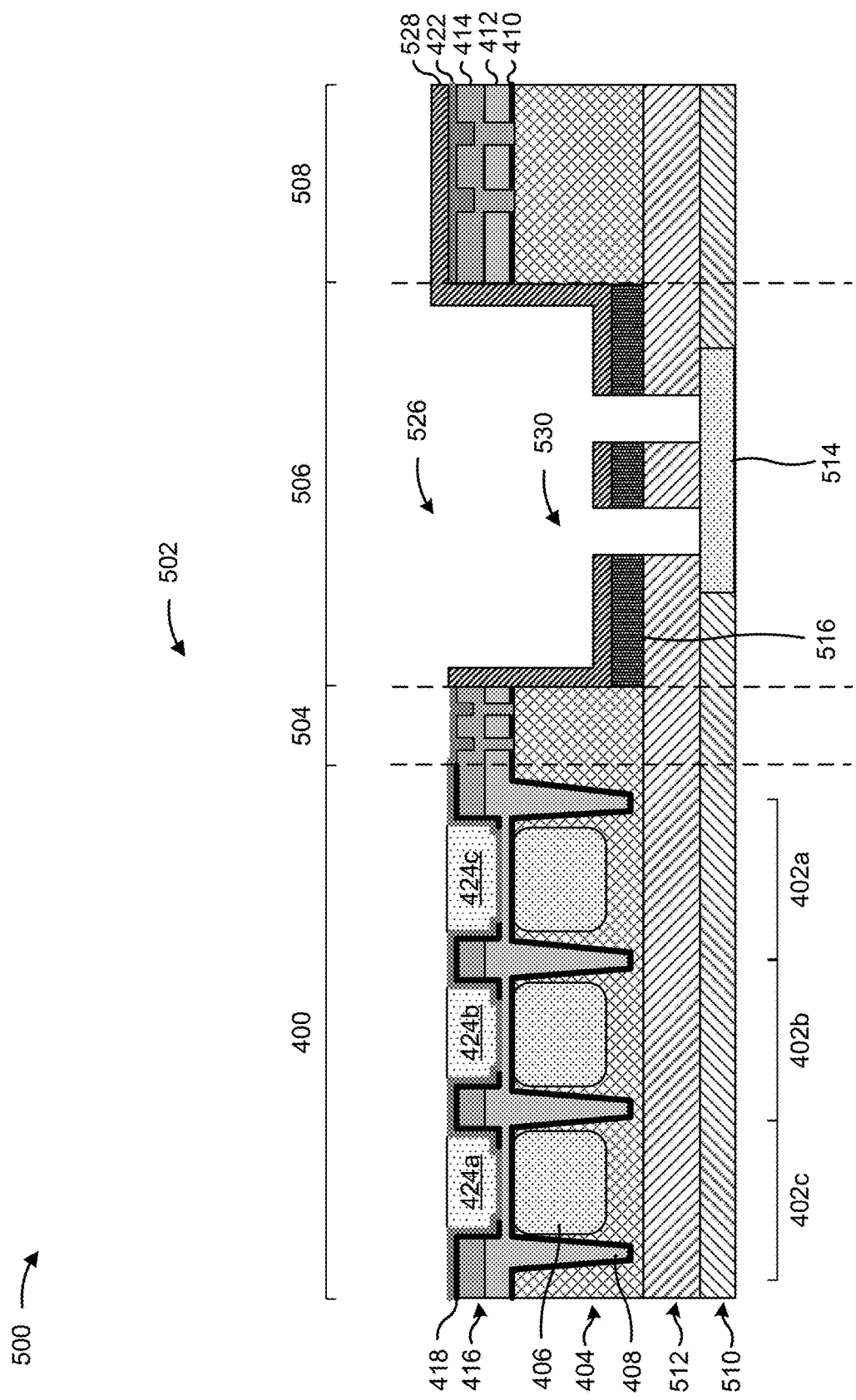
Figure 5R:
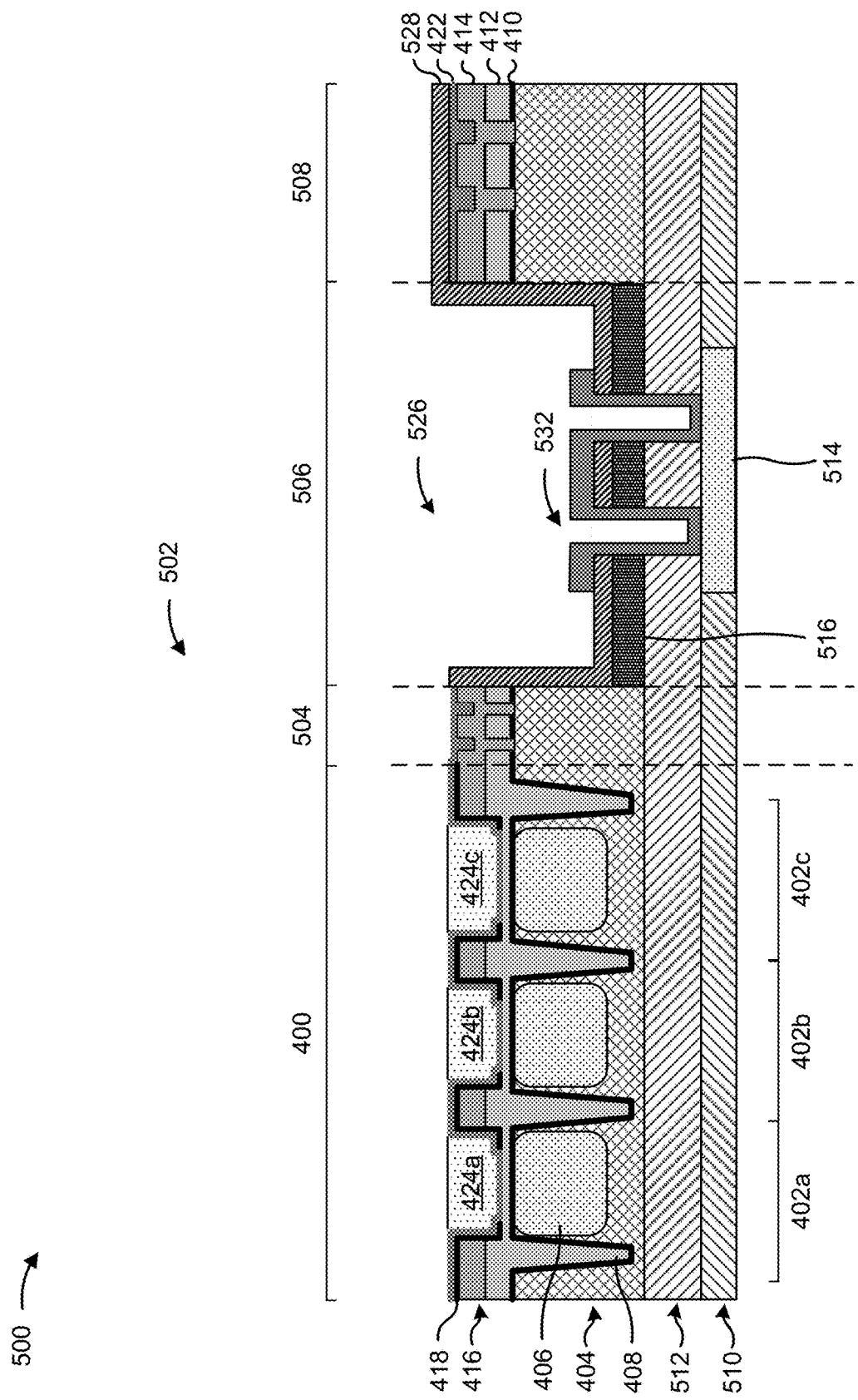
Figure 5S:
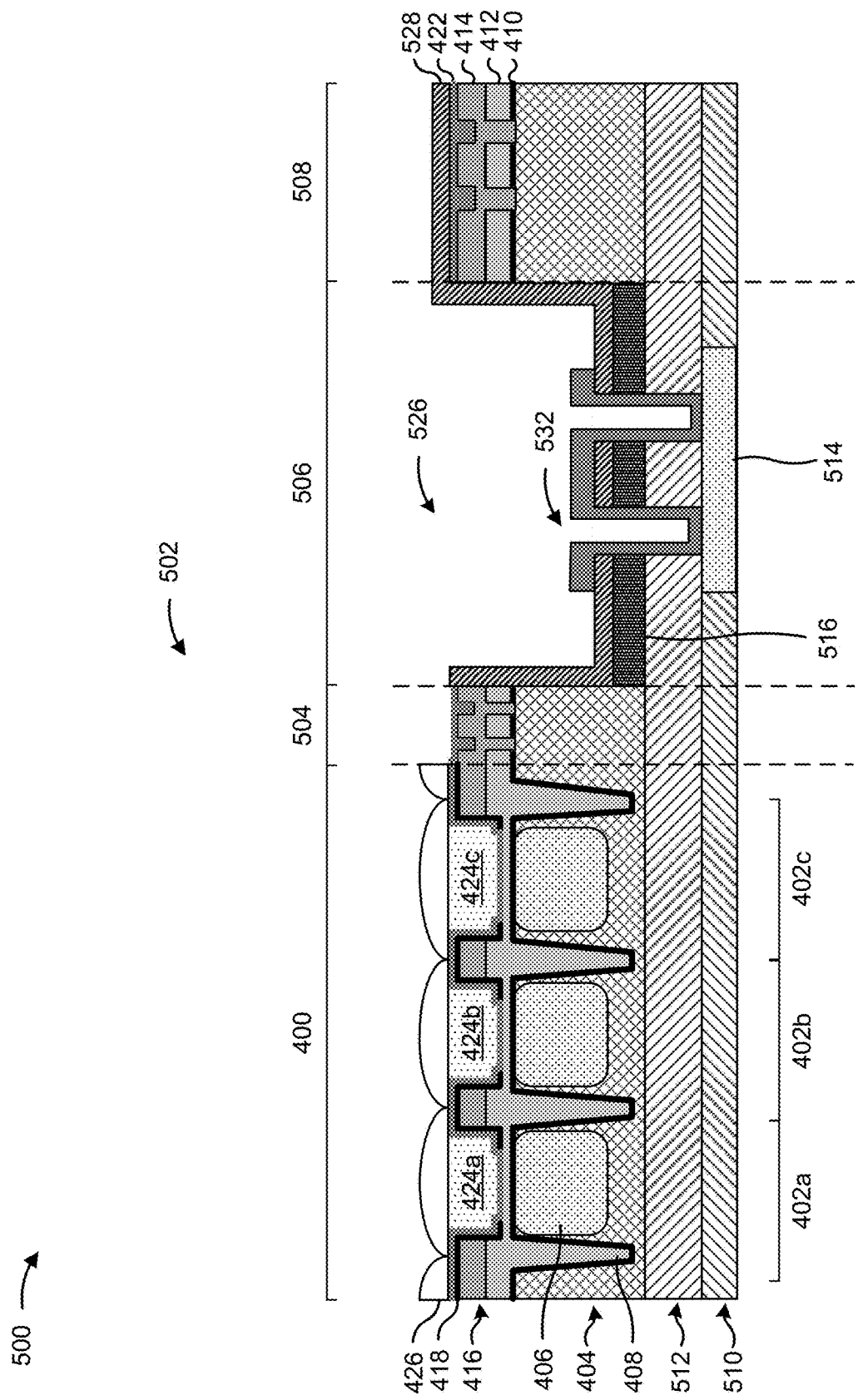

FIGS. 5A-5S are diagrams of an example implementation 500 described herein. Example implementation 500 may be an example process for forming an image sensor 502 including the pixel array 400 having a metal shielding structure 418 included therein. In some implementations, the example techniques and procedures described in connection with FIGS. 5A-5S may be used in connection with other pixel arrays described herein, such as the pixel array 200, the pixel array 300, the pixel array 600 described in connection with FIG. 6, the pixel array 700 described in connection with FIG. 7, and/or the pixel array 800 described in connection with FIG. 8. The image sensor 502 may include a CMOS image sensor, a BSI CMOS image sensor, or another type of image sensor.

As shown in FIG. 5A, the image sensor 502 may include a plurality of regions, such as the pixel array 400, a periphery region 504, a bonding pad region 506 (which may also be referred to as an E-pad region), and a scribe line region 508. Moreover, the image sensor 502 may include a plurality of layers, including an inter-metal dielectric (IMD) layer 510, an interlayer dielectric (ILD) layer 512, and the substrate 404.

The pixel array 400 may include the pixel sensors of the image sensor 502. The periphery region 504 may include a metal shielding section that includes one or more devices maintained in an optically dark environment. For example, the periphery region 504 may include a reference pixel that is used to establish a baseline of an intensity of light for the image sensor 502. In some implementations, the periphery region 504 includes a device section, such as one or more application-specific integrated circuit (ASIC) devices, one or more system-on-chip (SOC) devices, one or more transistors, and/or one or more other components configured to measure the amount of charge stored by the pixel sensors 402 to determine light intensity of incident light and/or to generate images and/or video (e.g., digital images, digital video).

The bonding pad region 506 may include one or more metallization layers 514 (e.g., conductive bonding pads, e-pads, metallization layers, vias, and/or the like) through which electrical connections between the image sensor 502 and outside devices and/or external packaging may be established. Moreover, the bonding pad region 506 may include a shallow trench isolation (STI) structure 516 to provide electrical isolation in the bonding pad region 506. The scribe line region 508 may include a region that separates one semiconductor die or portion of a semiconductor die that includes the image sensor 502 from an adjacent semiconductor die or portion of the semiconductor die that includes other image sensors and/or other integrated circuits.

The IMD layer 510 may include the metallization layers 514 and other metal interconnecting structures that connect the image sensor 502 to a package, to external electrical connections, and/or to other devices. The ILD layer 512 may provide electrical and optical isolation between the IMD layer 510 and the substrate 404. The substrate 404 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

As shown in FIG. 5B, one or more semiconductor processing tools may form a plurality of photodiodes 406 in the substrate 404. For example, the implantation tool 114 may dope the portions of the substrate 404 using an ion implantation technique to form a respective photodiode 406 for a plurality of pixel sensors 402 (e.g., pixel sensors 402a-402c). The substrate 404 may be doped with a plurality of types of ions to form a p-n junction for each photodiode 406. For example, the substrate 404 may be doped with an n-type dopant to form a first portion (e.g., an n-type portion) of a photodiode 406 and a p-type dopant to form a second portion (e.g., a p-type portion) of the photodiode 406. In some implementations, another technique is used to form the photodiodes 406 such as diffusion.

As shown in FIG. 5C, openings may be formed in the substrate 404 to form an isolation structure 408 (e.g., a DTI structure) in the substrate 404. In particular, the openings may be formed such that the isolation structure 408 may be formed between each of the photodiodes 406 of the pixel sensors 402. In some implementations, one or more semiconductor processing tools may be used to form the one or more openings for the isolation structure 408 in the substrate 404. For example, the deposition tool 102 may form a photoresist layer on the substrate 404, the exposure tool 104 may expose the photoresist layer to a radiation source to pattern the photoresist layer, the developer tool 106 may develop and remove portions of the photoresist layer to expose the pattern, and the etch tool 108 may etch portions of substrate 404 to form the openings for the isolation structure 408 in the substrate 404. In some implementations, a photoresist removal tool removes the remaining portions of the photoresist layer (e.g., using a chemical stripper and/or another technique) after the etch tool 108 etches the substrate 404.

As shown in FIG. 5D, an ARC 410 may be formed above and/or on the substrate 404, may be formed in the isolation structure 408. In particular, a semiconductor processing tool (e.g., the deposition tool 102) may deposit the ARC 410 using a CVD technique, a PVD technique, an ALD technique, or another type of deposition technique. The ARC 410 may include a suitable material for reducing a reflection of incident light projected toward the photodiodes 406. For example, the ARC 410 may include nitrogen-containing material. In some implementations, the semiconductor processing tool may form the ARC 410 to a thickness in a range from approximately 200 angstroms to approximately 1000 angstroms.

As shown in FIG. 5E, the isolation structure 408 may be filled with an oxide layer 412. In particular, a semiconductor processing tool (e.g., the deposition tool 102) may deposit the oxide layer 412 (e.g., a silicon oxide ($SiO_x$), a tantalum oxide (Ta$_x$O$_y$), or another type of oxide) such that the oxide layer 412 is formed in the isolation structure 408, over the photodiodes 406, and over the substrate 404. The semiconductor processing tool may deposit the oxide layer 412 using various CVD techniques and/or atomic layer deposition (ALD) techniques, such as PECVD, HDP-CVD, SACVD, or PEALD.

As shown in FIG. 5F, a plurality of openings 518 (e.g., trenches, holes) may be formed through the oxide layer 412 and the ARC 410 in the periphery region 504, and a plurality of openings 520 (e.g., trenches, holes) may be formed through the oxide layer 412 and the ARC 410 in the scribe line region 508. The openings 518 and 520 may be formed by coating the oxide layer 412 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 518 and 520 into the oxide layer 412 and the ARC 410 to the substrate 404 (e.g., using the etching tool 108) based on the pattern in the photoresist.

As shown in FIG. 5G, a metal layer 414 may be formed over and/or on the oxide layer 412 and in the openings 518 and 520. The metal layer 414 may be formed of a metallic material, such as tungsten (W), copper (Cu), aluminum (Al), cobalt (Co), nickel (Ni), titanium (Ti), tantalum (Ta), another conductive material, and/or an alloy including one or more thereof. The metal layer 414 may be formed to a thickness in a range of approximately 10 angstroms to approximately 2000 angstroms. In some implementations, a semiconductor processing tool (e.g., the plating tool 112) may form the metal layer 414 using a plating technique such as electroplating (or electro-chemical deposition) or electroless plating. In these examples, the semiconductor processing tool may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the image sensor 502. The plating solution reaches the image sensor 502 and deposits plating material ions onto the oxide layer 412 and in the openings 518 and 520 to form the metal layer 414.

As shown in FIG. 5H, an opening 522 may be formed through the metal layer 414 in the bonding pad region 506. Moreover, portions of the metal layer 414 may be removed in the pixel array 400 to form the grid structure 416 between the pixel sensors 402. In some implementations, a portion of the oxide layer 412 is removed to form the opening 522 and the grid structure 416. The opening 522 and the grid structure 416 may be formed by coating the metal layer 414 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 522 and the grid structure 416 into the metal layer 414 (e.g., using the etching tool 108) based on the pattern in the photoresist. In some implementations, the metal layer 414 and the oxide layer 412 may be etched by film deposition and blanked etching to remove a portion of the oxide layer 412 in the optical path of the pixel sensors 402 (e.g., in the openings between the grid structure 416). In some implementations, the metal layer 414 and the oxide layer 412 may be etched by mask layer photolithography and etching processes to remove a portion of the oxide layer 412 in the optical path.

As shown in Fig. SI, a metal shielding layer 524 may be formed over the pixel array 400. In particular, the metal shielding layer 524 may be formed above and/or on the grid structure 416 (e.g., the metal layer 414 of the grid structure 416) and above and/or on the oxide layer 412 over the photodiodes 406. In some implementations, a semiconductor processing tool (e.g., the plating tool 112) may deposit the metal shielding layer 524 using a plating technique such as electroplating (or electro-chemical deposition) or electroless plating. The metal shielding layer 524 may be formed of a metallic material such as tungsten (W), copper (Cu), aluminum (Al), cobalt (Co), nickel (Ni), titanium (Ti), or tantalum (Ta). Other examples of materials that may be used for the metal shielding layer 524 include a silicon nitride (SiN$_x$), a titanium nitride (TiN$_x$), a tantalum nitride (TaN$_x$), a hafnium oxide (HfO$_x$), a tantalum oxide (TaO$_x$), or an aluminum oxide (AlO$_x$), a zirconium oxide (ZrO$_x$), or silicon germanium (SiGe). The semiconductor processing tool may deposit the metal shielding layer 524 to a thickness in a range of approximately 10 angstroms to approximately 2000 angstroms.

As shown in FIG. 5J, portions of the metal shielding layer 524 may be removed to form the metal shielding structure 418. In particular, portions of the metal shielding layer 524 located over the photodiodes 406 of the pixel sensors 402 may be removed to permit incident light to shine through to the photodiodes 406. A semiconductor tool (e.g., the etch tool 108) may etch the metal shielding layer 524 to remove the portions of the metal shielding layer 524 to form the metal shielding structure 418. Extension regions (e.g., extension regions 420) of the metal shielding structure 418 that extend at least partially over the photodiodes 406 from the grid structure 416 may remain to provide optical crosstalk reduction for the pixel sensors 402.

FIG. 5K illustrates an example top-down view of the pixel array 400 in which the photodiodes 406 are square-shaped. As shown in FIG. 5K, the metal shielding structure 418 forms a grid along the boundaries or perimeters between adjacent pixel sensors 402. FIG. 5L illustrates another example top-down view of the pixel array 400 in which the photodiodes 406 include a combination of square-shaped pixel sensors and octagon-shaped pixel sensors. As shown in FIG. 5L, the metal shielding structure 418 extends along the boundaries or perimeters between adjacent octagon-shaped pixel sensors and between octagon-shaped pixel sensors and square-shaped pixel sensors.

As shown in FIG. 5M, a passivation layer 422 may be formed over the metal shielding structure 418, over the oxide layer 412 in the pixel array 400 and the bonding pad region 506, and over the metal layer 414 in the periphery region 504 and the scribe line region 508. In particular, a semiconductor processing tool (e.g., the deposition tool 102) may conformally deposit an oxide material (e.g., a silicon oxide (SiO$_x$) or another type of oxide) such that the passivation layer 422 is formed using various CVD techniques and/or ALD techniques, such as PECVD, HDP-CVD, SACVD, or PEALD.

As shown in FIG. 5N, respective color filter regions 424 may be formed for each of the pixel sensors 402 in the pixel array 400. For example, a color filter region 424a may be formed above the photodiode 406 for the pixel sensor 402a, a color filter region 424b may be formed above the photodiode 406 for the pixel sensor 402b, a color filter region 424c may be formed above the photodiode 406 for the pixel sensor 402c, and so on. Each color filter region 424 may be formed in between the grid structure 416 to reduce color mixing between adjacent pixel sensors 402. Alternatively, the areas between the grid structure 416 may be filled with the passivation layer 422, and a color filter layer including the color filter regions 424 may be formed on the passivation layer 422 above the grid structure 416. In some implementations, a semiconductor processing tool (e.g., the deposition tool 102) may deposit the color filter regions 242 using a CVD technique, a PVD technique, an ALD technique, or another type of deposition technique.

As shown in FIG. 5O, an opening 526 may be formed in the bonding pad region 506. In particular, the opening 526 may be formed through the passivation layer 422, through the metal layer 414, through the oxide layer 412, through the ARC 41, and through the substrate 404 to the STI structure 516. The opening 526 may be formed by coating the passivation layer 422 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 526 (e.g., using the etch tool 108) based on the pattern in the photoresist.

As shown in FIG. 5P, a buffer oxide layer 528 may be formed over the STI structure 516 in the opening 526 of the bonding pad region 506. In particular, a semiconductor processing tool (e.g., the deposition tool 102) may deposit an oxide material (e.g., a silicon oxide ($SiO_x$) or another type of oxide) such that the buffer oxide layer 528 is formed using various CVD techniques and/or ALD techniques, such as PECVD, HDP-CVD, SACVD, or PEALD.

As shown in FIG. 5Q, openings 530 (or vias) may be formed in the opening 526 of the bonding pad region 506. In particular, the openings 530 may be formed through the buffer oxide layer 528, through the STI structure 516, through the ILD layer 512, and to a metallization layer 514 in the 1MB layer 510. The openings 530 may be formed by coating the buffer oxide layer 528 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 530 (e.g., using the etch tool 108) based on the pattern in the photoresist.

As shown in FIG. 5R, a bonding pad 532 may be formed in the openings 530. For example, a semiconductor processing tool (e.g., the deposition tool 102 or the plating tool 112) may form a metal layer (e.g., an aluminum layer, a copper layer, a tungsten layer, a gold layer, a silver layer, a metal alloy layer, or another type of metal layer) on the buffer oxide layer 528, on the STI structure 516, and in the openings 530. Portions of the metal layer may be removed by coating the metal layer with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the portions (e.g., using the etch tool 108) based on the pattern in the photoresist to form the bonding pad 532.

As shown in FIG. 5S, a micro-lens layer 426 including a plurality of micro-lenses is formed over and/or on the color filter regions 424. The micro-lens layer 426 may include a respective micro-lens for each of the pixel sensors 402 included in the pixel array 400. For example, a micro-lens may be formed over and/or on the color filter region 424a of the pixel sensor 402a, a micro-lens may be formed over and/or on the color filter region 424b of the pixel sensor 402b, a micro-lens may be formed over and/or on the color filter region 424c of the pixel sensor 402c, and so on.

As indicated above, FIGS. 5A-5S are provided as examples. Other examples may differ from what is described with regard to FIGS. 5A-5S.

Figure 6:
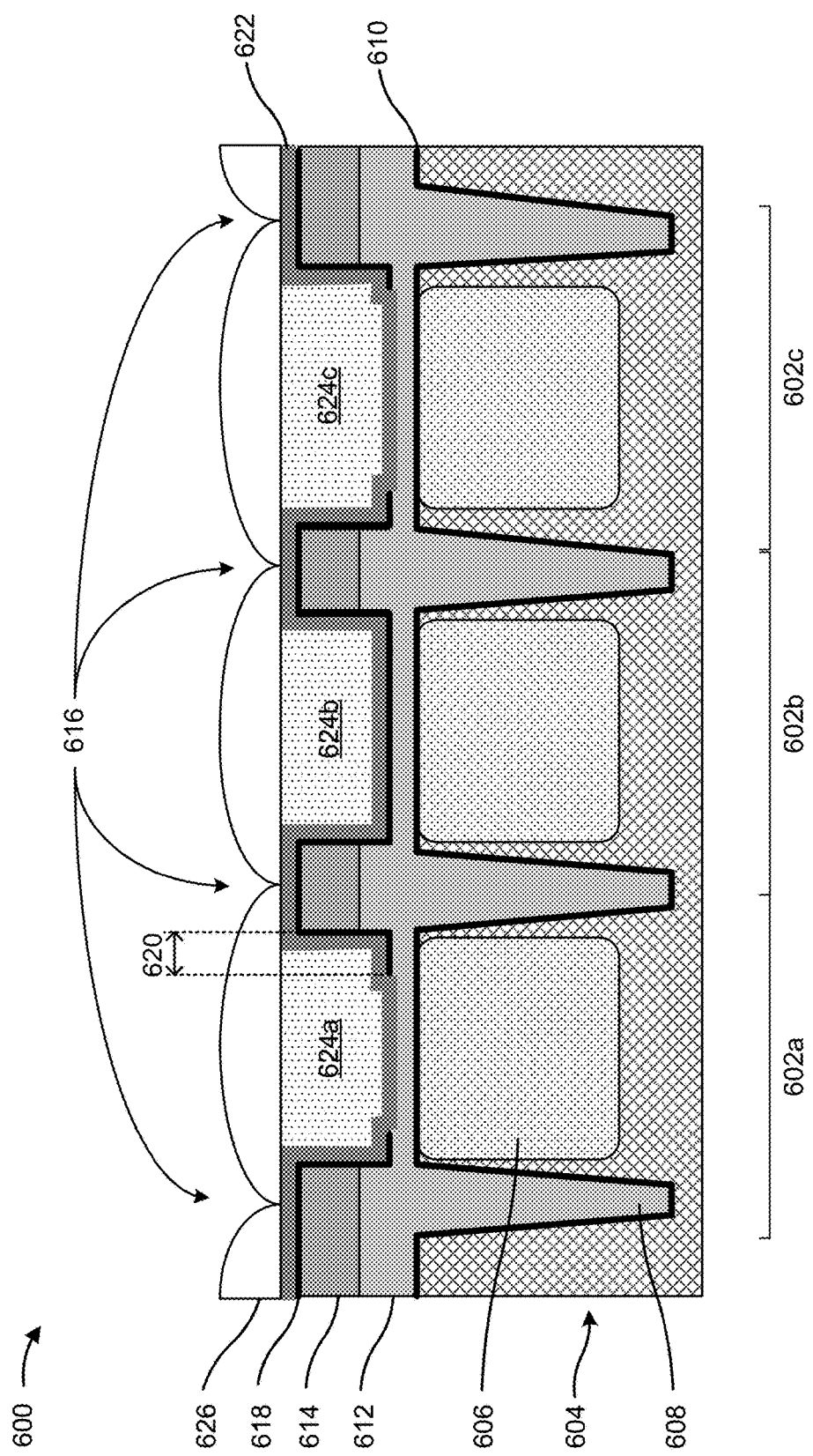
FIGS. 6-8 are diagrams of example pixel arrays described herein.

FIG. 6 is a diagram of an example pixel array 600 described herein. In some implementations, the example pixel array 600 illustrated in FIG. 6 may include, or may be included in, the pixel array 200 (or a portion thereof) and/or the pixel array 300 (or a portion thereof). In some implementations, the pixel array 600 may be included in an image sensor. The image sensor may be a CMOS image sensor, a BSI CMOS image sensor, or another type of image sensor.

The pixel array 600 may be included in an image sensor that is configured to employ a light emitting diode (LED) flicker reduction (LFR) technique. An image sensor with a high dynamic range (e.g., 100 dB or more) may be beneficial in some applications. For example, an image sensor with a dynamic range of 100 dB or more may be beneficial in an automotive application to be able to handle different extreme lighting conditions, such as driving from a dark tunnel into bright sunlight. Another example of an extreme lighting condition in the automotive context occurs when the image sensor needs to image LED illuminated light sources (e.g., vehicle lights, traffic lights, signs, and/or the like) that are pulsed at for example 90-300 Hertz (Hz) with a high peak light intensity. In such an LED lighting situation, there is often flickering present in output images caused by the LED light sources, which can result in unreliable or inaccurate image sensing. Thus, in addition to requiring a high dynamic range, the image sensor may need to employ an LFR technique.

As shown in FIG. 6, the pixel array 600 may include a plurality of adjacent pixel sensors 602 (e.g., pixel sensors 602a-602c), a substrate 604, respective photodiodes 606 for each of the pixel sensors 602, an isolation structure 608 between the photodiodes 606, an ARC 610, an oxide layer 612, a metal layer 614, a grid structure 616, a metal shielding structure 618 including extension regions 620, a passivation layer 622, color filter regions 624 (e.g., color filter regions 624a-624c), and a micro-lens layer 626, similar to the pixel array 400 described above in connection with FIG. 4.

To employ an LFR technique, the pixel array 600 may include a subset of pixel sensors 602 in which the metal shielding structure 618 is included over the entire area (e.g., the entire top surface area) of the photodiodes 606 of the subset of pixel sensors 602. Including the metal shielding structure 618 over the entire top surface area of the photodiodes 606 of the subset of pixel sensors 602 reduces the quantum efficiency (QE) of the subset of pixel sensors 602. The lower QE for the subset of pixel sensors 602 results in increased integration times for the subset of pixel sensors 602. The longer integration times for the subset of pixel sensors 602 facilitates capture of LED light, which enables the subset of pixel sensors 602 to be utilized to reduce LED flicker without being overexposed.

The subset of pixel sensors 602 configured for LFR (e.g., that include the metal shielding structure 618 over the entire top surface area of the associated photodiodes 606) may be interspersed in the pixel array 600 with non-LFR pixel sensors 602 (e.g., pixel sensors 602 in which the extension regions 620 of the metal shielding structure 618 extend over a portion of the top surface area of the associated photodiodes 606). In some implementations, the non-LFR pixel sensors 602 (e.g., pixel sensor 602a and 602c) may be large pixel sensors or octagon-shaped pixel sensors (such as pixel sensors 302 of the pixel array 300) to provide high performance in normal light conditions, and the LFR pixel sensors 602 (e.g., pixel sensor 602b) may be small pixel sensors or square-shaped pixel sensors (such as pixel sensors 304 of the pixel array 300) to provide prolonged exposure times for extended signal collection.

As indicated above, FIG. 6 is provided as an example. Other examples may differ from what is described with regard to FIG. 6.

Figure 7:
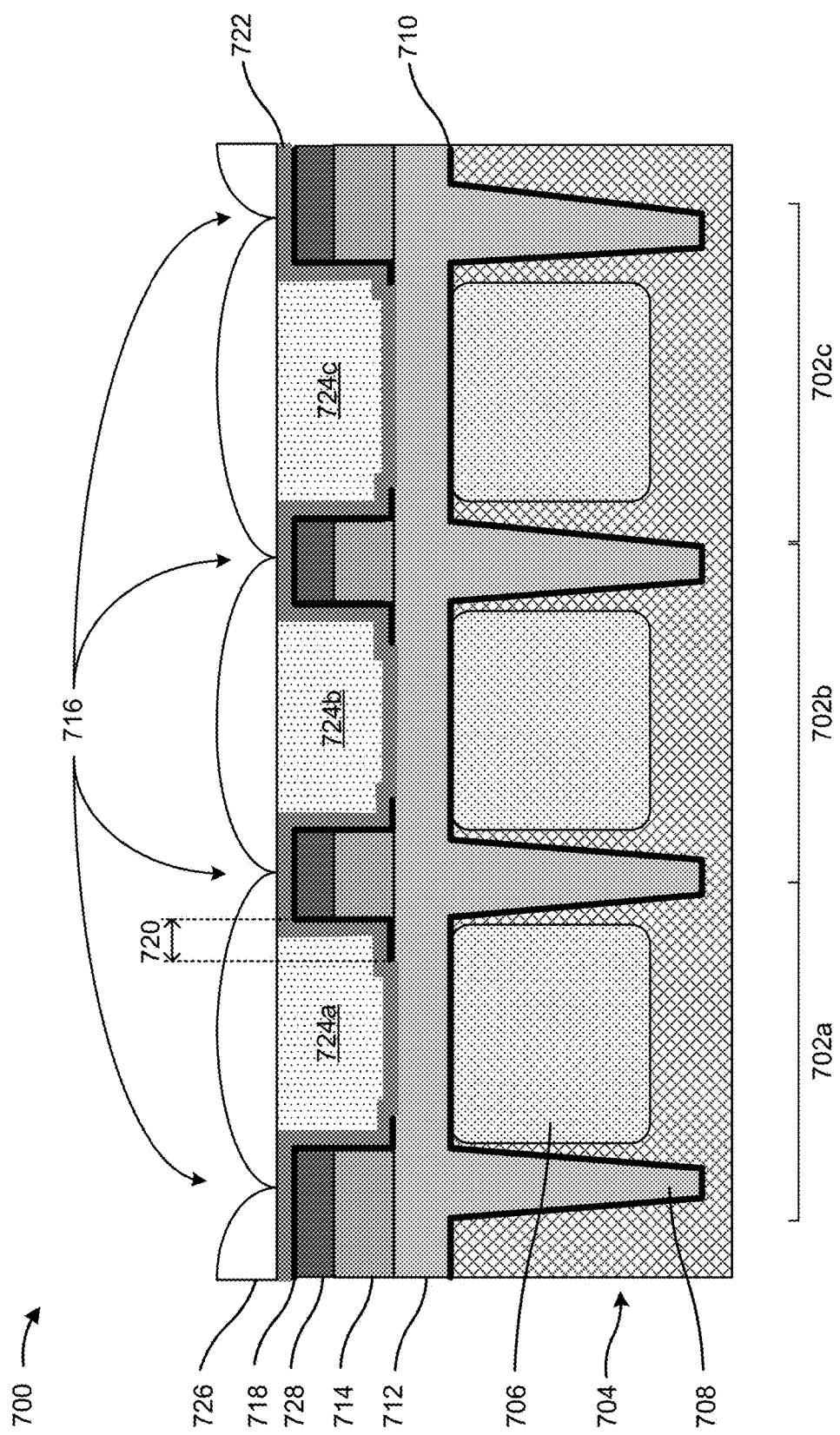

FIG. 7 is a diagram of an example pixel array 700 described herein. In some implementations, the example pixel array 700 illustrated in FIG. 7 may include, or may be included in, the pixel array 200 (or a portion thereof) and/or the pixel array 300 (or a portion thereof). In some implementations, the pixel array 700 may be included in an image sensor. The image sensor may be a CMOS image sensor, a BSI CMOS image sensor, or another type of image sensor.

As shown in FIG. 7, the pixel array 700 may include a plurality of adjacent pixel sensors 702 (e.g., pixel sensors 702a-702c), a substrate 704, respective photodiodes 706 for each of the pixel sensors 702, an isolation structure 708 between the photodiodes 706, an ARC 710, an oxide layer 712, a metal layer, 714, a grid structure 716, a metal shielding structure 718 including extension regions 720, a passivation layer 722, color filter regions 724 (e.g., color filter regions 724a-724c), and a micro-lens layer 726, similar to the pixel array 400 described above in connection with FIG. 4.

In addition, the pixel array 700 may include a dielectric layer 728 above and/or on the metal layer 714 to increase the height of the grid structure 716. The dielectric layer 728 may be included above and/or on the metal layer 714 in implementations where a taller grid structure 716 may be used to block and/or reflect incident light. For example, a taller grid structure 716 may be used to block and/or reflect incident light in implementations with wider pixel sensors 702 such that a greater angle range of incident light may be blocked and/or reflect. The dielectric layer 728 may be used instead of stacking multiple metal layers to avoid discontinuity and structural issues. Moreover, the dielectric layer 728 may be used in implementations in which the dielectric layer 728 may also be used in other areas of the image sensor in which the pixel array 700 is included such that no additional deposition operations are needed to be added to increase the height of the grid structure 716. The dielectric layer 728 may include a silicon oxide (SiOx), a silicon nitride (SiNx), a silicon carbide (SiCx), a titanium nitride (TiNx), a tantalum nitride (TaNx), a hafnium oxide (HfOx), a tantalum oxide (TaOx), or an aluminum oxide (AlOx), or another oxide or dielectric material.

As indicated above, FIG. 7 is provided as an example. Other examples may differ from what is described with regard to FIG. 7.

Figure 8:
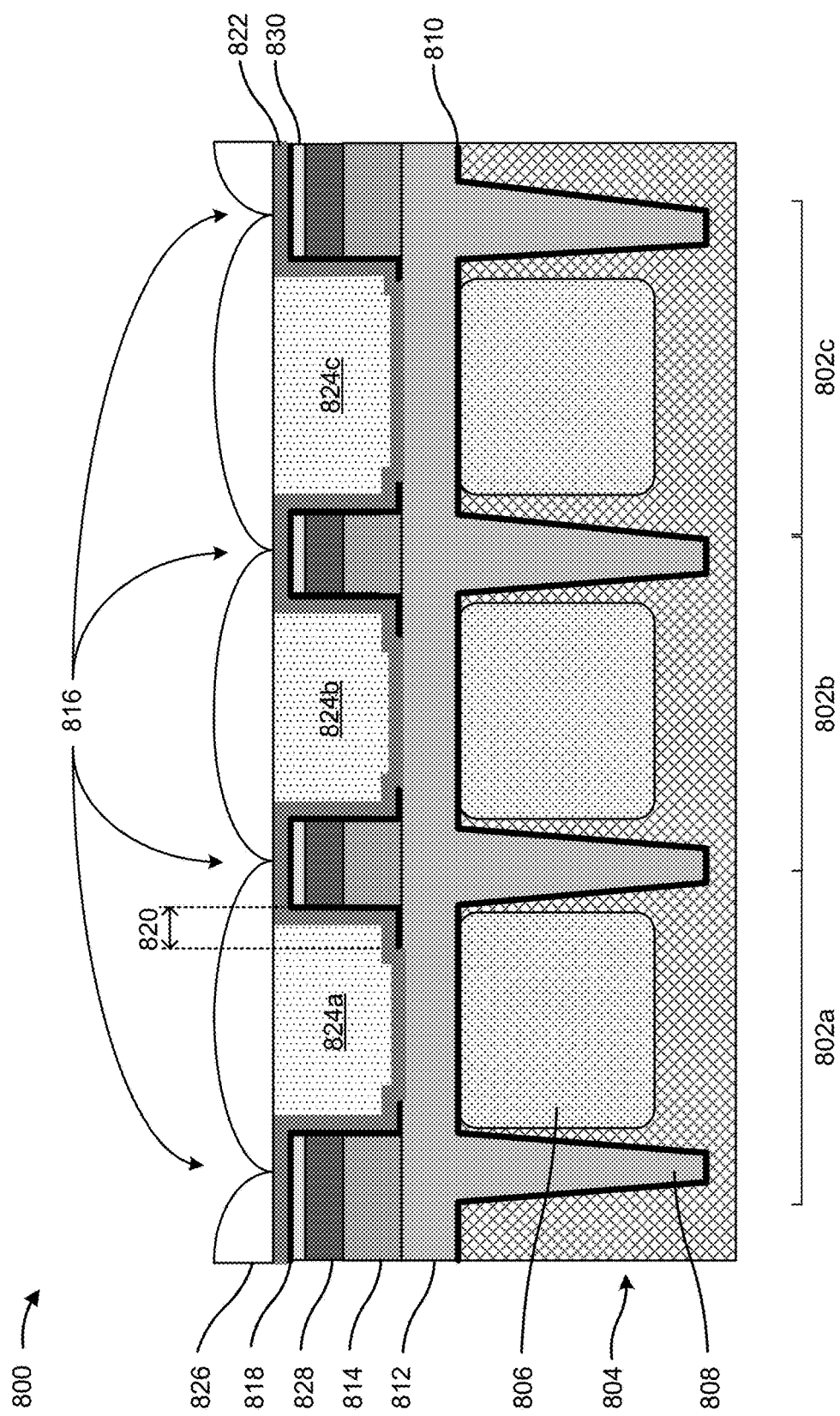

FIG. 8 is a diagram of an example pixel array 800 described herein. In some implementations, the example pixel array 800 illustrated in FIG. 8 may include, or may be included in, the pixel array 200 (or a portion thereof) and/or the pixel array 300 (or a portion thereof). In some implementations, the pixel array 800 may be included in an image sensor. The image sensor may be a CMOS image sensor, a BSI CMOS image sensor, or another type of image sensor.

As shown in FIG. 8, the pixel array 800 may include a plurality of adjacent pixel sensors 802 (e.g., pixel sensors 802a-802c), a substrate 804, respective photodiodes 806 for each of the pixel sensors 802, an isolation structure 808 between the photodiodes 806, an ARC 810, an oxide layer 812, a metal layer, 814, a grid structure 816, a metal shielding structure 818 including extension regions 820, a passivation layer 822, color filter regions 824 (e.g., color filter regions 824a-824c), and a micro-lens layer 826, similar to the pixel array 400 described above in connection with FIG. 4.

In addition, the pixel array 800 may include a plurality of dielectric layers, such as dielectric layer 828 and dielectric layer 830, above and/or on the metal layer 814 to increase the height of the grid structure 816. The dielectric layer 828 may be included above and/or on the metal layer 814, and the dielectric layer 830 may be included above and/or on the dielectric layer 828. The dielectric layers 828 and 830 may be included above and/or on the metal layer 814 in implementations where a taller grid structure 816 may be used to block and/or reflect incident light. For example, a taller grid structure 816 may be used to block and/or reflect incident light in implementations with wider pixel sensors 802 such that a greater angle range of incident light may be blocked and/or reflect. The dielectric layers 828 and 830 may be used instead of stacking multiple metal layers to avoid discontinuity and structural issues. Moreover, the dielectric layers 828 and 830 may be used in implementations in which the dielectric layers 828 and 830 may also be used in other areas of the image sensor in which the pixel array 800 is included such that no additional deposition operations are needed to be added to increase the height of the grid structure 816. The dielectric layers 828 and 830 may include a silicon oxide (SiOx), a silicon nitride (SiNx), a silicon carbide (SiCx), a titanium nitride (TiNx), a tantalum nitride (TaNx), a hafnium oxide (HfOx), a tantalum oxide (TaOx), or an aluminum oxide (AlOx), a silicon oxynitride (SiON), or another oxide or dielectric material. The dielectric layers 828 and 830 may include different materials.

As indicated above, FIG. 8 is provided as an example. Other examples may differ from what is described with regard to FIG. 8.

Figure 9:
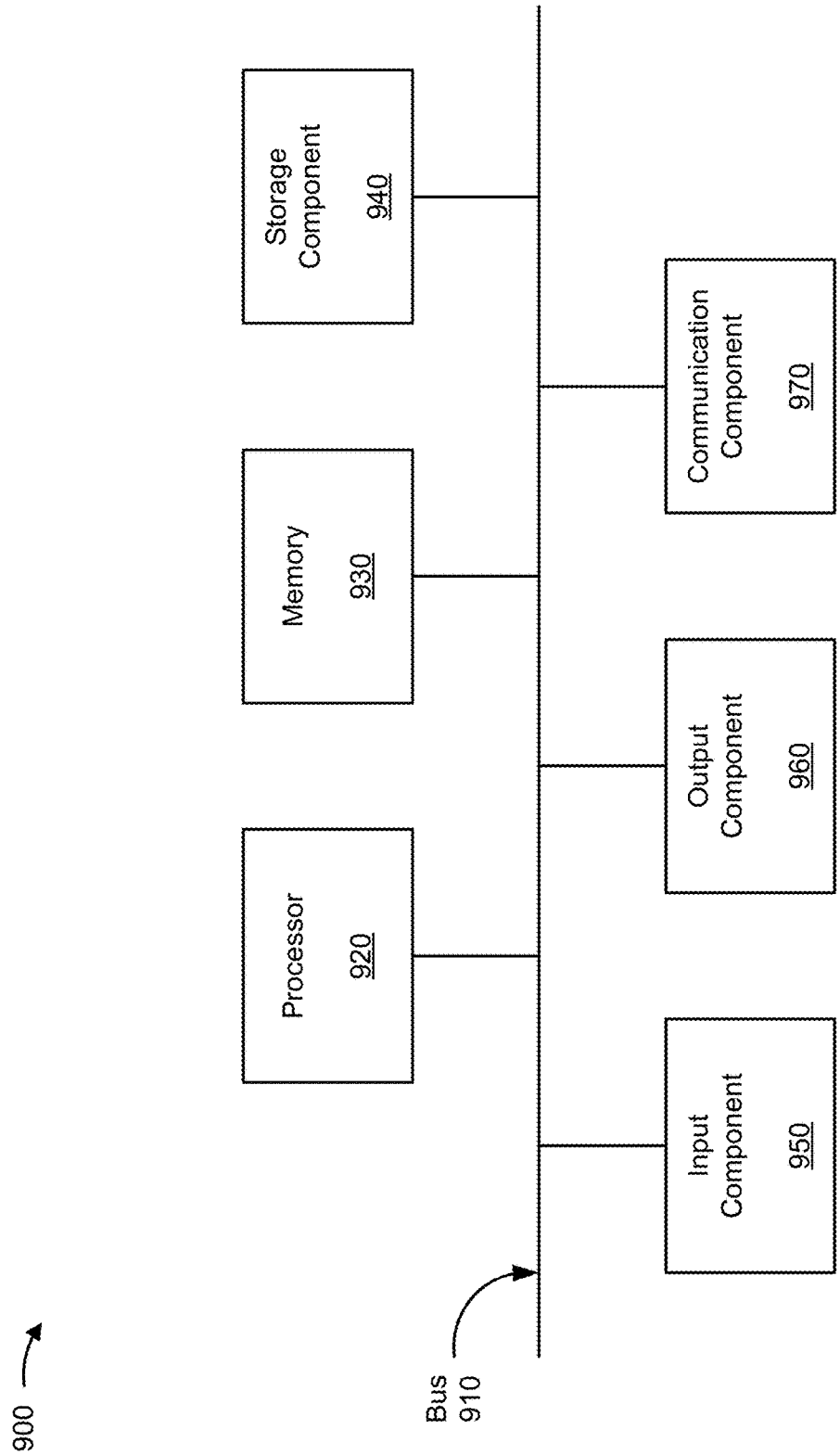
FIG. 9 is a diagram of example components of one or more devices of FIG. 1.

FIG. 9 is a diagram of example components of a device 900. In some implementations, one or more of the semiconductor processing tools 102-114 and/or wafer/die transport tool 116 may include one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
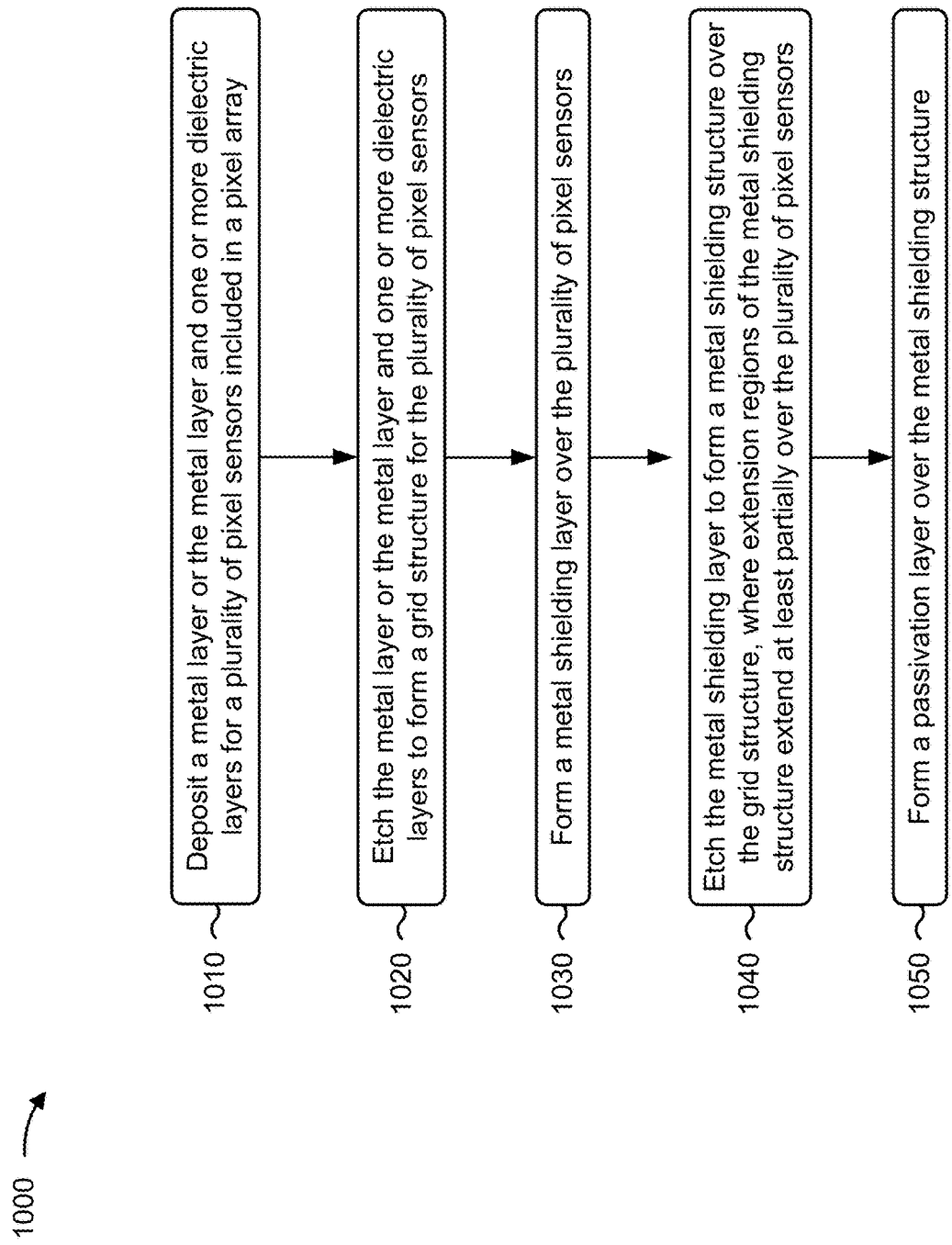
FIGS. 10 and 11 are flowcharts of example processes relating to forming a pixel array.

FIG. 10 is a flowchart of an example process 1000 associated with forming a pixel array. In some implementations, one or more process blocks of FIG. 10 may be performed by one or more semiconductor processing tools (e.g., one or more of the semiconductor processing tools 102-114). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include depositing a metal layer or the metal layer and one or more dielectric layers for a plurality of pixel sensors included in a pixel array (block 1010). For example, the one or more semiconductor processing tools may deposit a metal layer (e.g., the metal layer 414, 615, 714, and/or 814) or the metal layer and one or more dielectric layers (e.g., the dielectric layer 728 and/or 828, and/or the dielectric layer 830) for a plurality of pixel sensors (e.g., the pixel sensors 202, 302, 304, 402, 602, 702, and/or 802) included in a pixel array (e.g., the pixel array 200, 300, 400, 600, 700, and/or 800), as described above.

As further shown in FIG. 10, process 1000 may include etching the metal layer or the metal layer and one or more dielectric layers to form a grid structure for the plurality of pixel sensors (block 1020). For example, the one or more semiconductor processing tools may etch the metal layer (e.g., the metal layer 414, 615, 714, and/or 814) or the metal layer and the one or more dielectric layers (e.g., the dielectric layer 728 and/or 828, and/or the dielectric layer 830) to form a grid structure (e.g., the grid structure 416, 616, 716, and/or 816) for the plurality of pixel sensors (e.g., the pixel sensors 202, 302, 304, 402, 602, 702, and/or 802), as described above.

As further shown in FIG. 10, process 1000 may include forming a metal shielding layer over the grid structure and over the plurality of pixel sensors (block 1030). For example, the one or more semiconductor processing tools may form a metal shielding layer (e.g., the metal shielding layer 524) over the grid structure (e.g., the grid structure 416, 616, 716, and/or 816) and over the plurality of pixel sensors (e.g., the pixel sensors 202, 302, 304, 402, 602, 702, and/or 802), as described above.

As further shown in FIG. 10, process 1000 may include etching the metal shielding layer to form a metal shielding structure over the grid structure, where extension regions of the metal shielding structure extend at least partially over the plurality of pixel sensors (block 1040). For example, the one or more semiconductor processing tools may etch the metal shielding layer (e.g., the metal shielding layer 524) to form a metal shielding structure (e.g., the metal shielding structure 418, 618, 718, and/or 818) over the grid structure, as described above. In some implementations, extension regions (420, 620, 720, and/or 820) of the metal shielding structure extend at least partially over the plurality of photodiodes (e.g., the photodiodes 406, 606, 706, and/or 806).

As further shown in FIG. 10, process 1000 may include forming a passivation layer over the metal shielding structure (block 1050). For example, the one or more semiconductor processing tools may form a passivation layer (e.g., the passivation layer 422, 622, 722, and/or 822) over the metal shielding structure (e.g., the metal shielding structure 418, 618, 718, and/or 818), as described above.

Process 1000 may include additional implementations, such as any single implementation or any combination of implementations described above, below, and/or in connection with one or more other processes described elsewhere herein.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
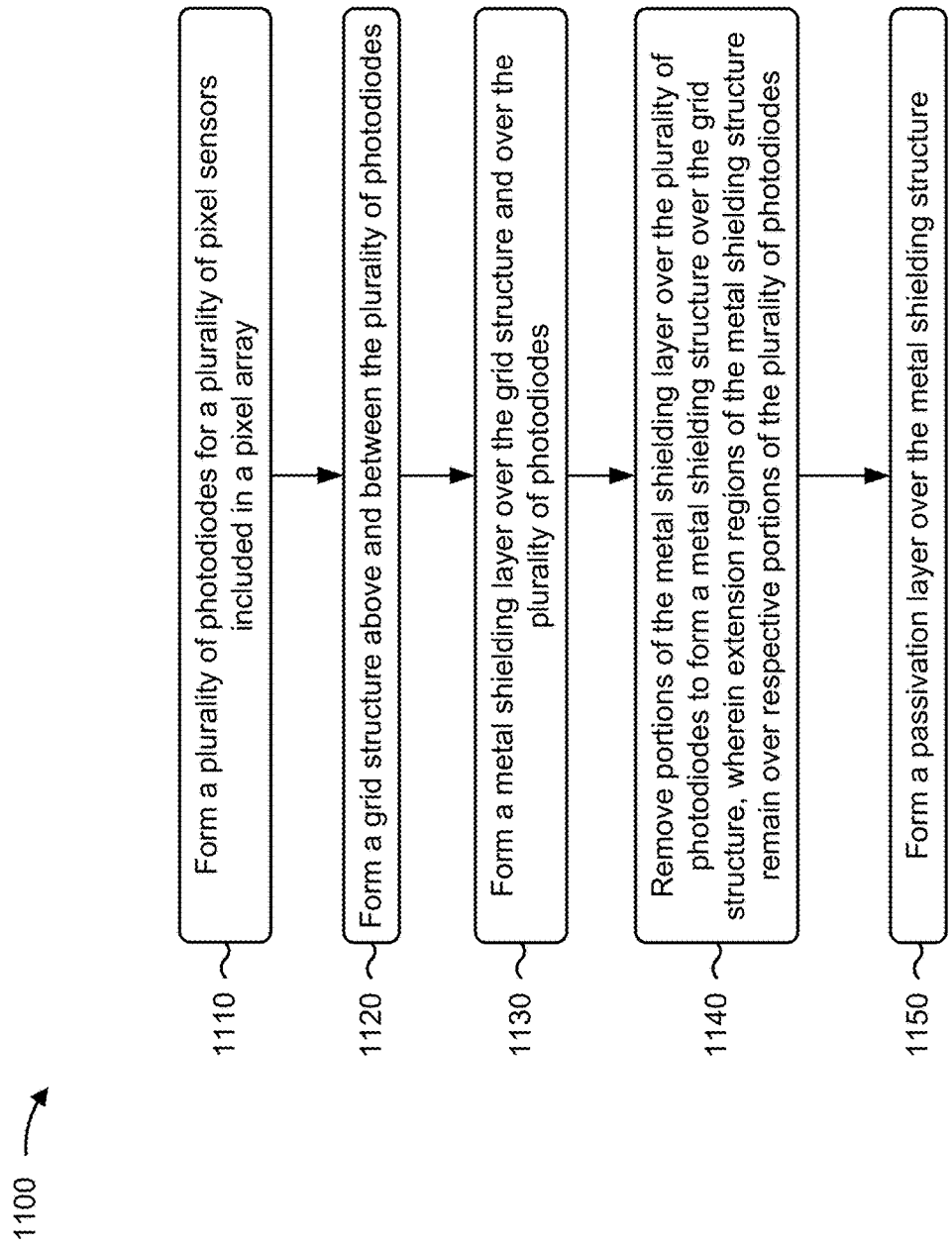

FIG. 11 is a flowchart of an example process 1100 associated with forming a pixel array. In some implementations, one or more process blocks of FIG. 11 may be performed by one or more semiconductor processing tools (e.g., one or more of the semiconductor processing tools 102-114). Additionally, or alternatively, one or more process blocks of FIG. 11 may be performed by one or more components of device 900, such as processor 920, memory 930, storage component 940, input component 950, output component 960, and/or communication component 970.

As shown in FIG. 11, process 1100 may include forming a plurality of photodiodes for a plurality of pixel sensors included in a pixel array (block 1110). For example, the one or more semiconductor processing tools may form a plurality of photodiodes (e.g., the photodiodes 406, 606, 706, and/or 806) for a plurality of pixel sensors (e.g., the pixel sensors 202, 302, 304, 402, 602, 702, and/or 802) included in a pixel array (e.g., the pixel array 200, 300, 400, 600, 700, and/or 800), as described above.

As further shown in FIG. 11, process 1100 may include forming a grid structure above and between the plurality of photodiodes (block 1120). For example, the one or more semiconductor processing tools may form a grid structure (e.g., the grid structure 416, 616, 716, and/or 816) above and between the plurality of photodiodes (e.g., the photodiodes 406, 606, 706, and/or 806), as described above.

As further shown in FIG. 11, process 1100 may include forming a metal shielding layer over the grid structure and over the plurality of photodiodes (block 1130). For example, the one or more semiconductor processing tools may form a metal shielding layer (e.g., the metal shielding layer 524) over the grid structure (e.g., the grid structure 416, 616, 716, and/or 816) and over the plurality of photodiodes (e.g., the photodiodes 406, 606, 706, and/or 806), as described above.

As further shown in FIG. 11, process 1100 may include removing portions of the metal shielding layer over the plurality of photodiodes to form a metal shielding structure over the grid structure, where extension regions of the metal shielding structure remain over respective portions of the plurality of photodiodes (block 1140). For example, the one or more semiconductor processing tools may remove portions of the metal shielding layer (e.g., the metal shielding layer 524) over the plurality of photodiodes (e.g., the photodiodes 406, 606, 706, and/or 806) to form a metal shielding structure (e.g., the metal shielding structure 418, 618, 718, and/or 818) over the grid structure, wherein extension regions (420, 620, 720, and/or 820) of the metal shielding structure remain over respective portions of the plurality of photodiodes, as described above. In some implementations, extension regions (420, 620, 720, and/or 820) of the metal shielding structure remain over respective portions of the plurality of photodiodes.

As further shown in FIG. 11, process 1100 may include forming a passivation layer over the metal shielding structure (block 1150). For example, the one or more semiconductor processing tools may form a passivation layer (e.g., the passivation layer 422, 622, 722, and/or 822) over the metal shielding structure (e.g., the metal shielding structure 418, 618, 718, and/or 818), as described above.

Process 1100 may include additional implementations, such as any single implementation or any combination of implementations described above, below, and/or in connection with one or more other processes described elsewhere herein.

In a first implementation, forming the grid structure comprises forming a metal layer (e.g., the metal layer 714) above a first oxide layer (e.g., the first oxide layer 712) included in the pixel array, forming a dielectric layer (e.g., the dielectric layer 728 and/or 828) over the metal layer (e.g., the metal layer 714), and etching the metal layer (e.g., the metal layer 714) and the dielectric layer (e.g., the dielectric layer 728 and/or 828) to form the grid structure (e.g., the grid structure 716). In a second implementation, alone or in combination with the first implementation, the metal layer (e.g., the metal layer 714) includes at least one of tungsten (W), copper (Cu), aluminum (Al), cobalt (Co), nickeling (Ni), titanium (Ti), tantalum (Ta), or an alloy including one or more thereof. In a third implementation, alone or in combination with one or more of the first and second implementations, the dielectric layer (e.g., the dielectric layer 728) includes at least one of a silicon oxide (SiOx), a silicon nitride (SiNx), a silicon carbide (SiCx), a titanium nitride (TiNx), a tantalum nitride (TaNx), a hafnium oxide (HfOx), a tantalum oxide (TaOx), or an aluminum oxide (AlOx).

In a fourth implementation, alone or in combination with one or more of the first through third implementations, forming the metal shielding structure (e.g., the metal shielding structure 418, 618, 718, and/or 818) includes forming the metal shielding layer to a thickness in a range of approximately 10 angstroms to approximately 2000 angstroms. In a fifth implementation, alone or in combination with one or more of the first through fourth implementations, forming the grid structure (e.g., the grid structure 416, 616, 716, and/or 816) includes forming the grid structure such that the grid structure is tapered between a top of the grid structure and a bottom of the grid structure. In a sixth implementation, alone or in combination with one or more of the first through fifth implementations, process 1100 includes forming a plurality of color filter regions (e.g., the color filter regions 424, 625, 724, and/or 824) on the passivation layer (e.g., the passivation layer 422, 622, 722, and/or 822) and over the plurality of photodiodes (e.g., the photodiodes 406, 606, 706, and/or 806), and forming a micro-lens layer (e.g., the micro-lens layer 426, 626, 726, and/or 826) over the plurality of color filter regions.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, a metal shielding structure is included on a grid structure between pixel sensors in a pixel array. The metal shielding structure laterally extends outward from the grid structure to reflect photons of incident light that might otherwise travel between the grid structure and an isolation structure of pixel sensors in the pixel array. The lateral extensions of the metal shielding structure reflect these photons to reduce crosstalk between adjacent pixel sensors, thereby increasing the performance of the pixel array.

As described in greater detail above, some implementations described herein provide a pixel array. The pixel array includes a plurality of pixel sensors. The pixel array includes a grid structure between the plurality of pixel sensors. The pixel array includes a metal shielding structure, over the grid structure, configured to prevent at least a portion of optical crosstalk between adjacent pixel sensors of the plurality of pixel sensors, where the metal shielding structure includes extension regions that extend from the grid structure and over at least a portion of the plurality of pixel sensors..

As described in greater detail above, some implementations described herein provide a method. The method includes forming a plurality of photodiodes for a plurality of pixel sensors included in a pixel array. The method includes forming a grid structure above and between the plurality of photodiodes. The method includes forming a metal shielding layer over the grid structure and over the plurality of photodiodes. The method includes removing portions of the metal shielding layer over the plurality of photodiodes to form a metal shielding structure over the grid structure, where extension regions of the metal shielding structure remain over respective portions of the plurality of photodiodes. The method includes forming a passivation layer over the metal shielding structure.

As described in greater detail above, some implementations described herein provide an image sensor. The image sensor includes a bonding pad region. The image sensor includes a periphery region adjacent to the bonding pad region. The image sensor includes a pixel array, adjacent to the periphery region, including, a plurality of pixel sensors each including a respective photodiode of a plurality of photodiodes an isolation structure between the plurality of photodiodes an oxide layer in the isolation structure and over the plurality of photodiodes a grid structure over the isolation structure a metal shielding structure over the grid structure and over the isolation structure, where the metal shielding structure includes extension regions adjacent to the grid structure and over at least a portion of an area of the plurality of photodiodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
a plurality of pixel sensors including a plurality of photodiodes;
an oxide layer over the plurality of pixel sensors;
a grid structure, between the plurality of pixel sensors, comprising a metal layer that has a first plurality of openings, in a first portion of the pixel array that is over the plurality of photodiodes, and that intersects with the oxide layer in a second portion of the pixel array that is outside of the plurality of photodiodes;
a metal shielding structure, comprising a plurality of extension regions and a plurality of second openings, configured to prevent at least a portion of optical crosstalk between adjacent pixel sensors of the plurality of pixel sensors,
wherein the plurality of extension regions define the plurality of second openings, and the plurality of second openings are over the plurality of photodiodes and within the plurality of first openings, and
wherein the metal shielding structure intersects with the oxide layer, in the first portion of the pixel array that is over the plurality of photodiodes, and with the metal layer in the second portion of the pixel array that is outside of the plurality of photodiodes; and
a passivation layer intersecting with the grid structure, in the second portion of the pixel array that is outside of the plurality of photodiodes, and with the oxide layer in the first portion of the pixel array that is over the plurality of photodiodes.

2. The pixel array of claim 1, further comprising:
a plurality of color filter regions in the first plurality of openings.

3. The pixel array of claim 1, wherein the metal shielding structure includes a material comprising at least one of:
tungsten (W),
copper (Cu),
aluminum (Al),
cobalt (Co),
nickel (Ni),
titanium (Ti), or
titanium nitride (TiN).

4. The pixel array of claim 1, wherein a dielectric constant of the metal shielding structure is greater than approximately 3.9.

5. The pixel array of claim 1, wherein a length of one or more of the plurality of extension regions is in a range of approximately 20 nanometers to approximately 100 nanometers.

6. An image sensor, comprising:
a bonding pad region;
a periphery region adjacent to the bonding pad region; and
a pixel array, adjacent to the periphery region, comprising:
a plurality of pixel sensors including a plurality of photodiodes,
an isolation structure between the plurality of photodiodes,
a single oxide layer comprising a first portion, in the isolation structure, and a second portion, over the plurality of photodiodes,
a grid structure, comprising a metal layer, over the isolation structure,
a metal shielding structure, comprising a plurality of extension regions and one or more openings, intersecting with the metal layer, in a first portion of the pixel array that is outside of the plurality of photodiodes, and with the single oxide layer in a second portion of the pixel array that is over the plurality of photodiodes, and
a passivation layer intersecting with the grid structure and the metal shielding structure.

7. The image sensor of claim 6, wherein at least two extension regions of the plurality of extension regions are included over approximately 1/10 to approximately 1/7 of a particular photodiode of the plurality of photodiodes.

8. The image sensor of claim 6, wherein the grid structure further comprises:
a first dielectric layer on the metal layer; and
a second dielectric layer on the first dielectric layer.

9. The image sensor of claim 6, wherein the plurality of pixel sensors comprises:
one or more octagon-shaped pixel sensors; and
one or more square-shaped pixel sensors.

10. The image sensor of claim 6, wherein the metal shielding structure includes a material having a reflection rate that is greater relative to a reflection rate of silicon dioxide (SiO2).

11. A pixel array, comprising:
a plurality of pixel sensors including a plurality of photodiodes;
an oxide layer over the plurality of pixel sensors;
a grid structure, between the plurality of pixel sensors, that has a first plurality of openings, in a first portion of the pixel array that is over the plurality of photodiodes, and that intersects with the oxide layer in a second portion of the pixel array that is outside of the plurality of photodiodes;
a metal shielding structure, comprising a plurality of extension regions and a second plurality of openings, configured to prevent at least a portion of optical crosstalk between adjacent pixel sensors of the plurality of pixel sensors,
wherein the metal shielding structure intersects with the oxide layer, in the first portion of the pixel array that is over the plurality of photodiodes, and with the grid structure in the second portion of the pixel array that is outside of the plurality of photodiodes,
wherein the plurality of extension regions includes:
a first extension region extending from the grid structure and over a first portion of a first photodiode of the plurality of photodiodes,
a second extension region extending from the grid structure and over a second portion of the first photodiode of the plurality of photodiodes,
a third extension region extending from the grid structure and over a first portion of a second photodiode, of the plurality of photodiodes, adjacent to the first photodiode, and a fourth extension region extending from the grid structure and over a second portion of the second photodiode of the plurality of photodiodes, and wherein the second plurality of openings are over the plurality of photodiodes and includes a first opening, extending between an end of the first extension region and an end of the second extension region, and a second opening extending between an end of the third extension region and an end of the fourth extension region; and a passivation layer over the grid structure and the metal shielding structure.

12. The pixel array of claim 11, further comprising:

a plurality of color filter regions in the second plurality of openings.

13. The pixel array of claim 11, wherein the metal shielding structure includes a material comprising at least one of:

tungsten (W),
copper (Cu),
aluminum (Al),
cobalt (Co),
nickel (Ni),
titanium (Ti), or
titanium nitride (TiN).

14. The pixel array of claim 11, wherein the pixel array is part of an image sensor.

15. The pixel array of claim 11, wherein the first extension region and the second extension region are included over approximately $1/10$ to approximately $1/7$ of the first photodiode of the plurality of photodiodes.

16. The pixel array of claim 1, wherein the passivation layer has a thickness in a range of approximately 10 angstroms to approximately 200 angstroms.

17. The image sensor of claim 6 wherein the passivation layer has a thickness in a range of approximately 10 angstroms to approximately 200 angstroms.

18. The image sensor of claim 6, wherein a portion of the passivation layer is over each at least one of the one or more openings of the metal shielding structure.

19. The image sensor of claim 18, wherein the portion of the passivation layer intersects with the single oxide layer.

20. The pixel array of claim 11, wherein the grid structure comprises:

a metal layer;
a first dielectric layer on the metal layer; and
a second dielectric layer on the first dielectric layer.

* * * * *